US008624165B2

(12) United States Patent
Kusuda et al.

(10) Patent No.: US 8,624,165 B2
(45) Date of Patent: Jan. 7, 2014

(54) HEAT TREATMENT APPARATUS FOR HEATING SUBSTRATE BY IRRADIATING SUBSTRATE WITH FLASHES OF LIGHT

(75) Inventors: Tatsufumi Kusuda, Kyoto (JP); Toshiaki Aotani, Kyoto (JP); Shinji Miyawaki, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 74 days.

(21) Appl. No.: 13/229,884

(22) Filed: Sep. 12, 2011

(65) Prior Publication Data

US 2012/0067864 A1    Mar. 22, 2012

(30) Foreign Application Priority Data

Sep. 16, 2010  (JP) ............................. JP2010-207599
Mar. 23, 2011  (JP) ............................. JP2011-063737

(51) Int. Cl.
*F27D 11/00* (2006.01)
*F26B 19/00* (2006.01)

(52) U.S. Cl.
USPC ........... 219/385; 219/390; 219/405; 219/411; 392/416; 392/418; 118/724; 118/725; 118/50.1

(58) Field of Classification Search
USPC .......... 219/385, 390, 405, 411; 392/416, 418; 118/724, 725, 50.1
See application file for complete search history.

(56) References Cited

U.S. PATENT DOCUMENTS

| 4,649,261 | A | 3/1987 | Sheets ........................... 219/390 |
| 6,717,158 | B1 | 4/2004 | Gat et al. |
| 6,771,895 | B2 | 8/2004 | Gat et al. |
| 7,038,174 | B2 | 5/2006 | Gat et al. |
| 7,102,141 | B2 * | 9/2006 | Hwang et al. ............ 250/455.11 |
| 7,608,802 | B2 | 10/2009 | Gat et al. |
| 2006/0291835 | A1 | 12/2006 | Nozaki et al. ................. 392/416 |

FOREIGN PATENT DOCUMENTS

| JP | 60-258928 | 12/1985 |
| JP | 2005-527972 | 9/2005 |
| JP | 2007-5532 | 1/2007 |
| WO | WO 03/085343 | 10/2003 |

OTHER PUBLICATIONS

Office Action issued by Taiwanese Patent Office on Sep. 17, 2013 in connection with corresponding Taiwan Patent Application No. 100118359 with Japanese and English Translation thereof.

* cited by examiner

*Primary Examiner* — Shawntina Fuqua
(74) *Attorney, Agent, or Firm* — Ostrolenk Faber LLP

(57) ABSTRACT

When a semiconductor wafer is preheated by halogen lamps, the temperature of a peripheral portion of the semiconductor wafer is lower than that of a central portion thereof. A laser light emitting part disposed immediately under the center of the semiconductor wafer is rotated about the center line of the semiconductor wafer, while laser light is directed from the laser light emitting part toward the peripheral portion of the semiconductor wafer. Thus, the irradiation spot of the laser light exiting the laser light emitting part swirls around along the peripheral portion of the back surface of the semiconductor wafer so as to draw a circular trajectory. As a result, the entire peripheral portion of the semiconductor wafer at a relatively low temperature is uniformly heated. This achieves a uniform in-plane temperature distribution of the semiconductor wafer.

15 Claims, 27 Drawing Sheets

F I G. 3
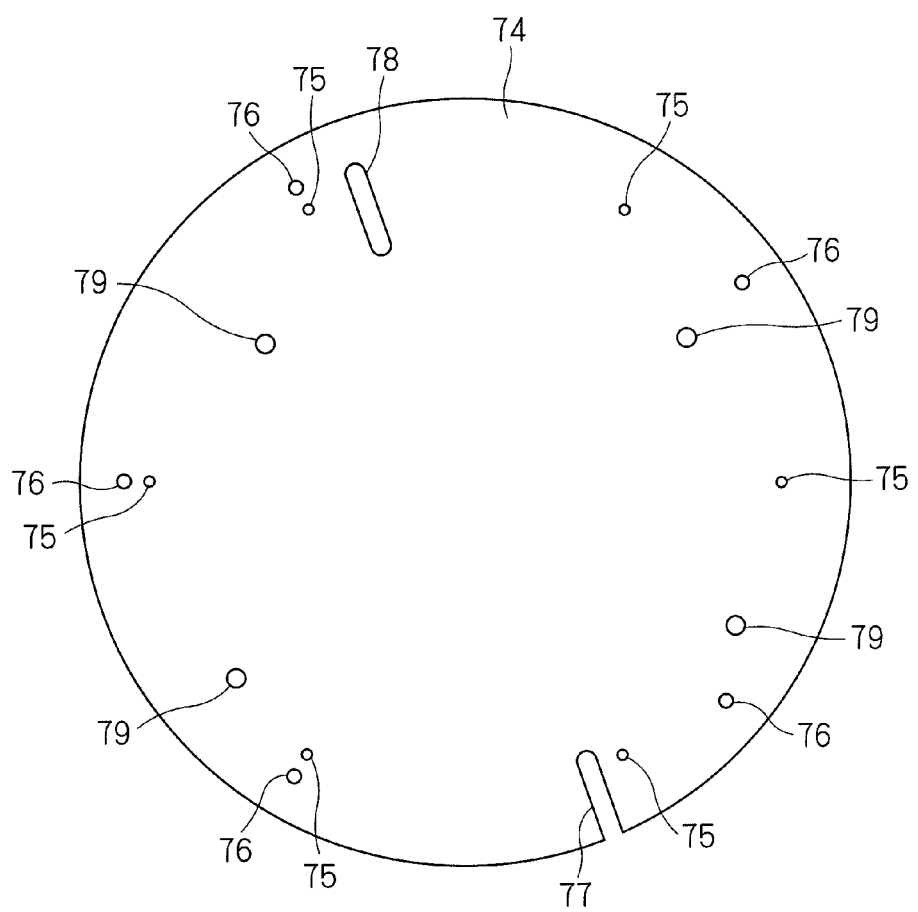

F I G. 4
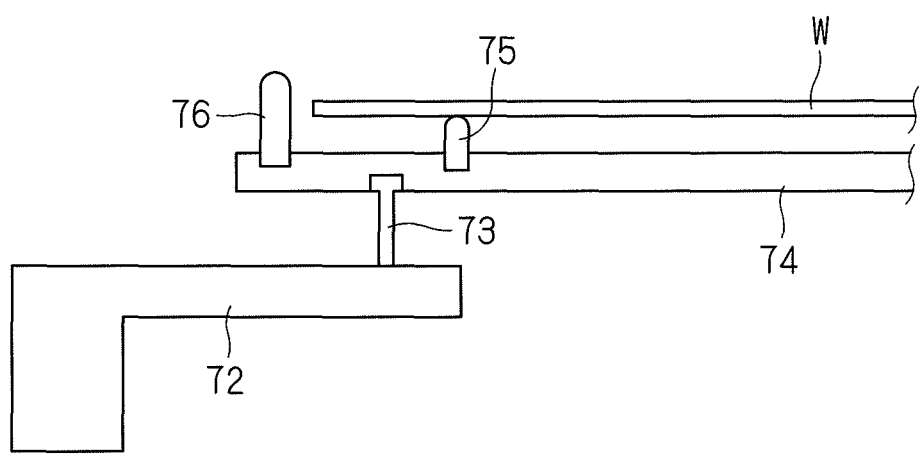

F I G. 5
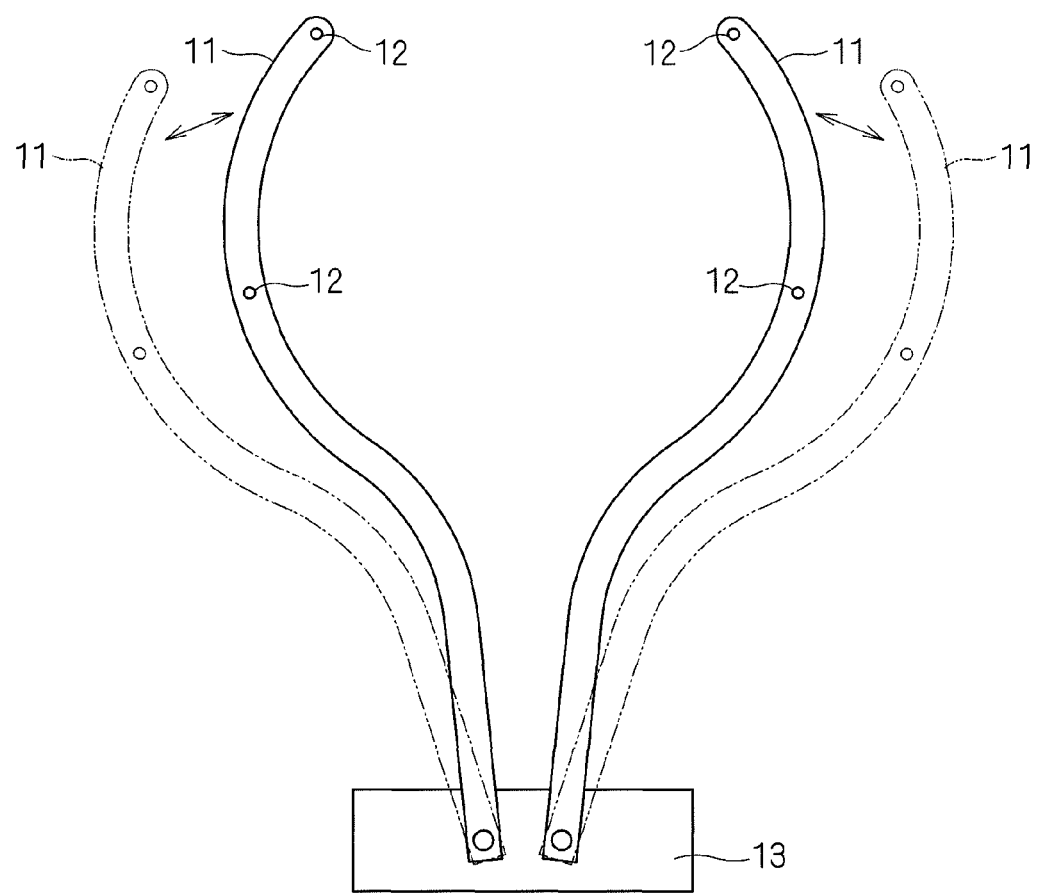

F I G . 8
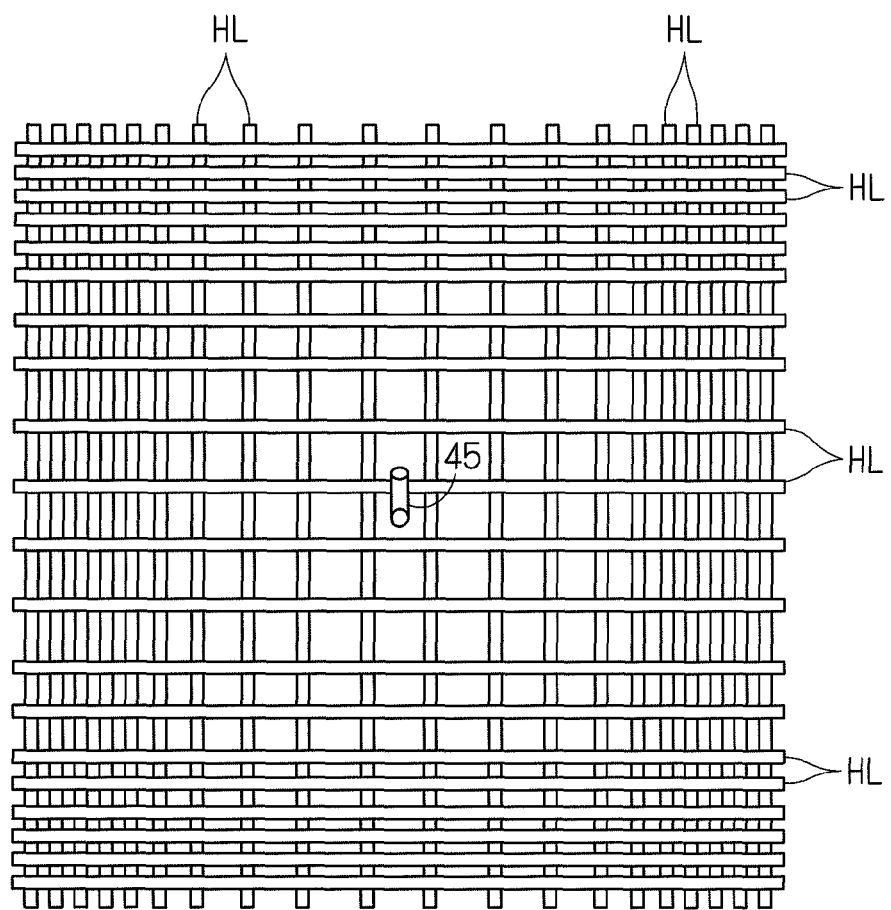

F I G. 9
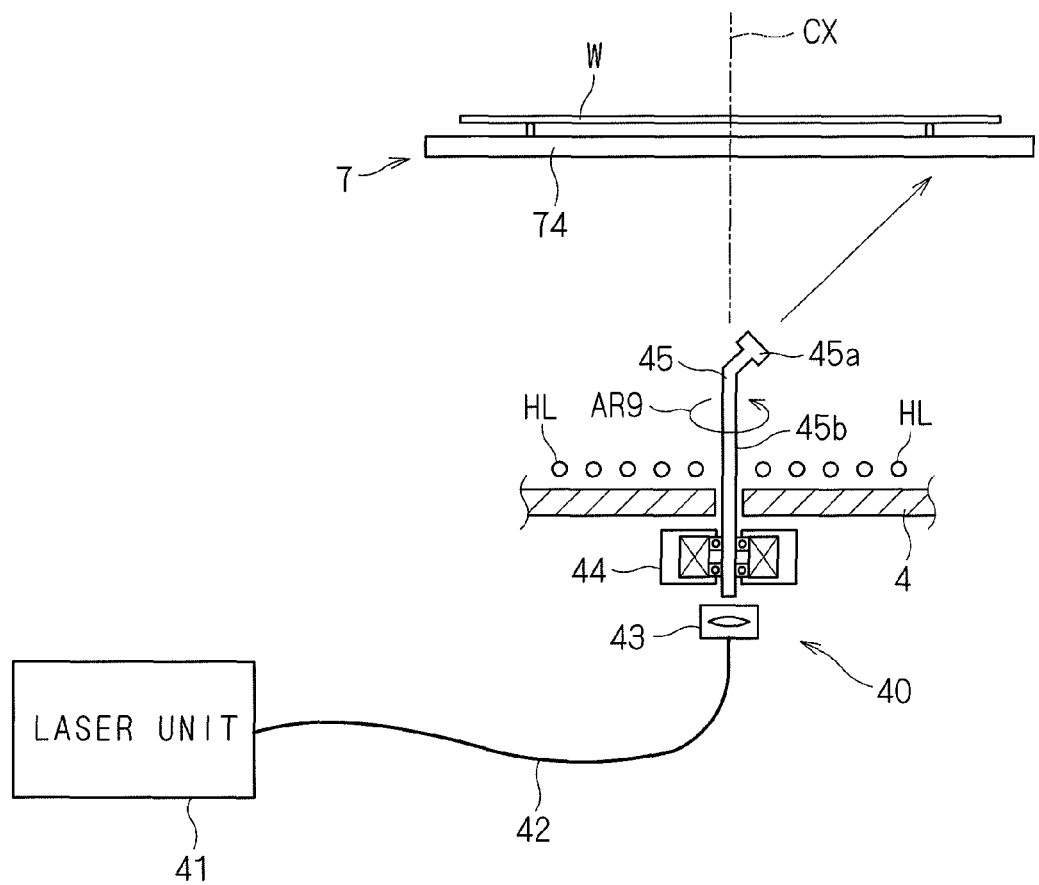

F I G . 1 0
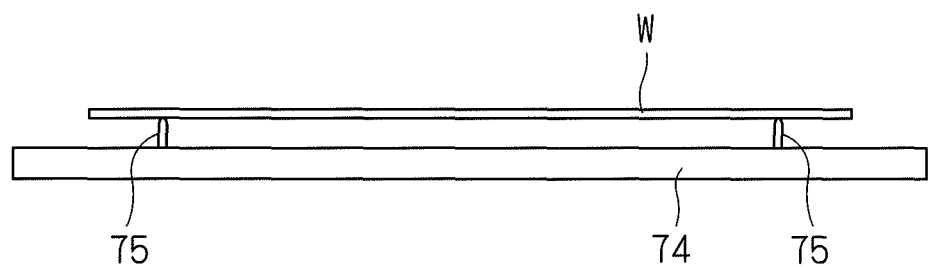

F I G . 1 1
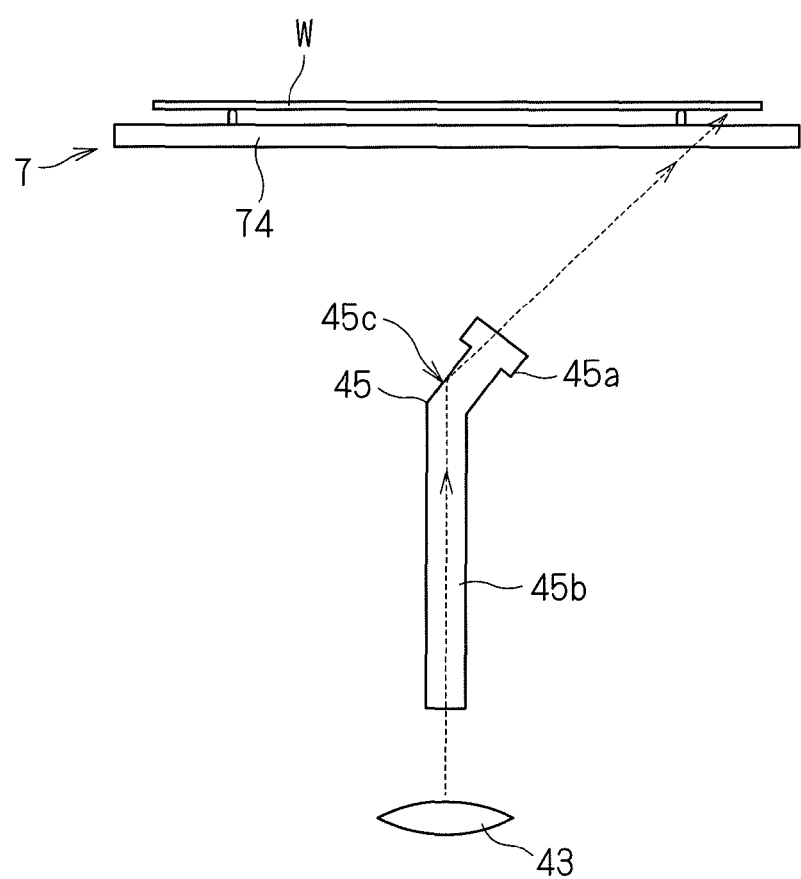

F I G . 1 2
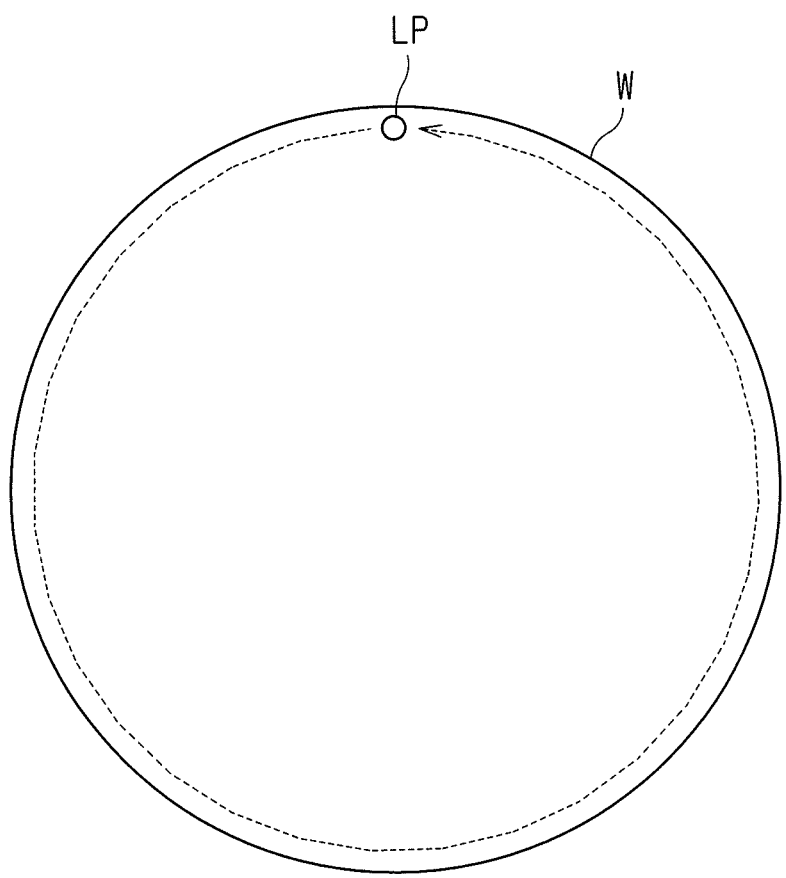

F I G . 1 3
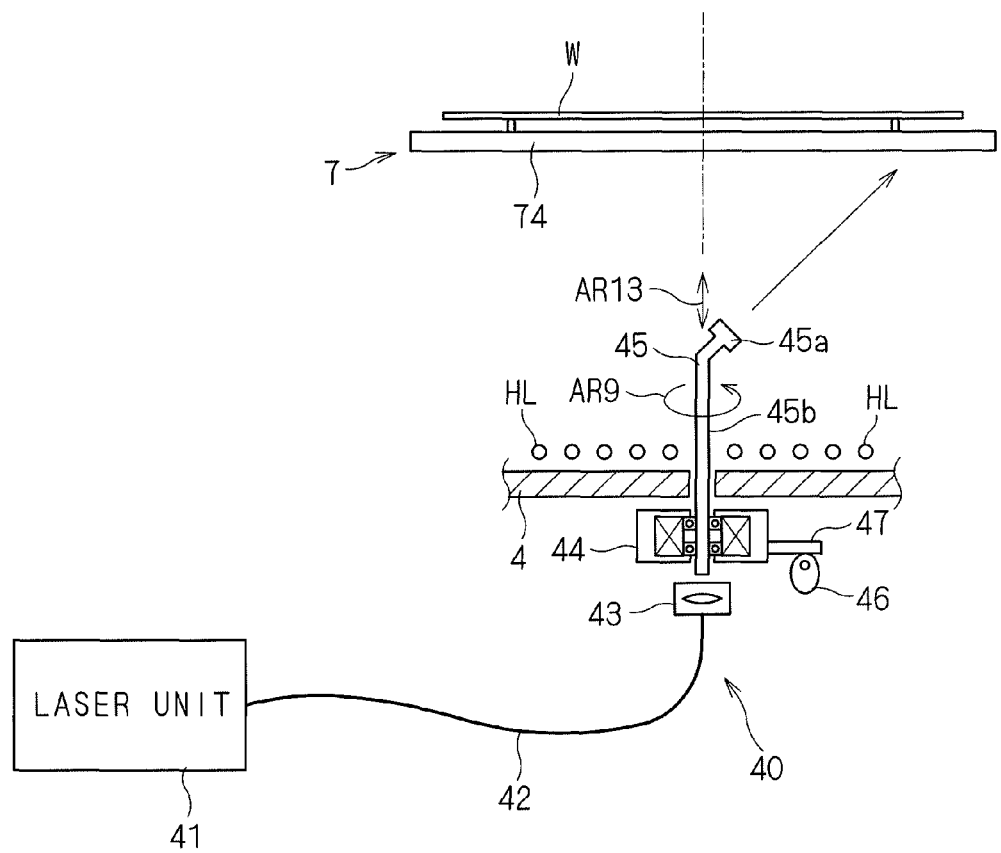

F I G . 1 5
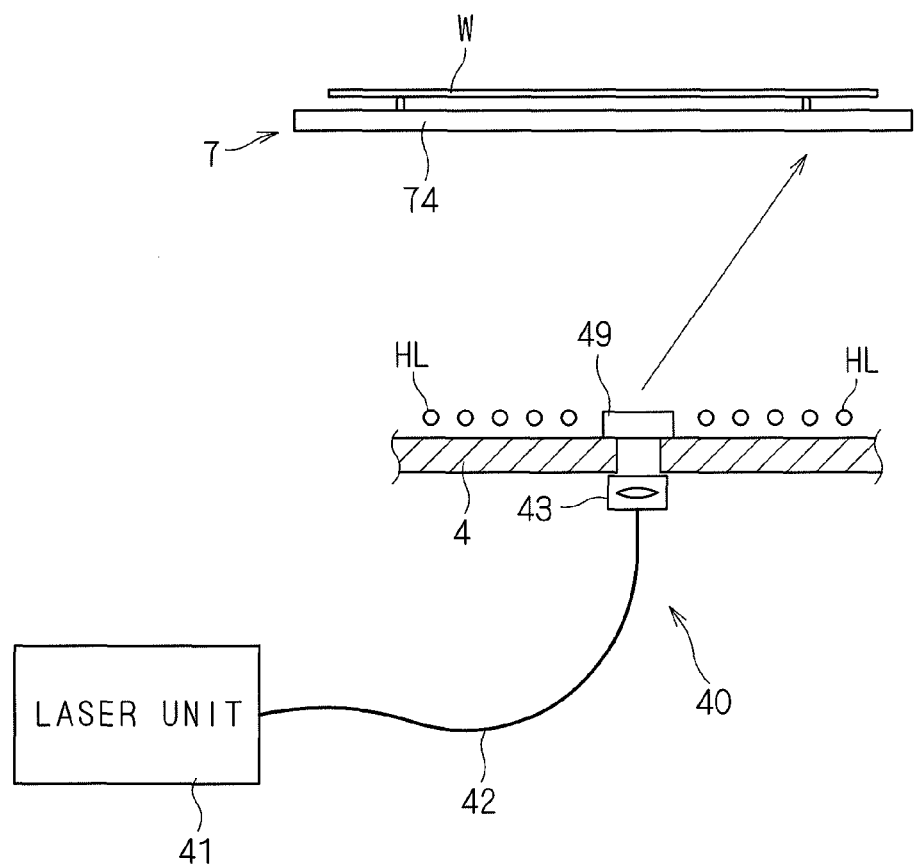

F I G . 1 8
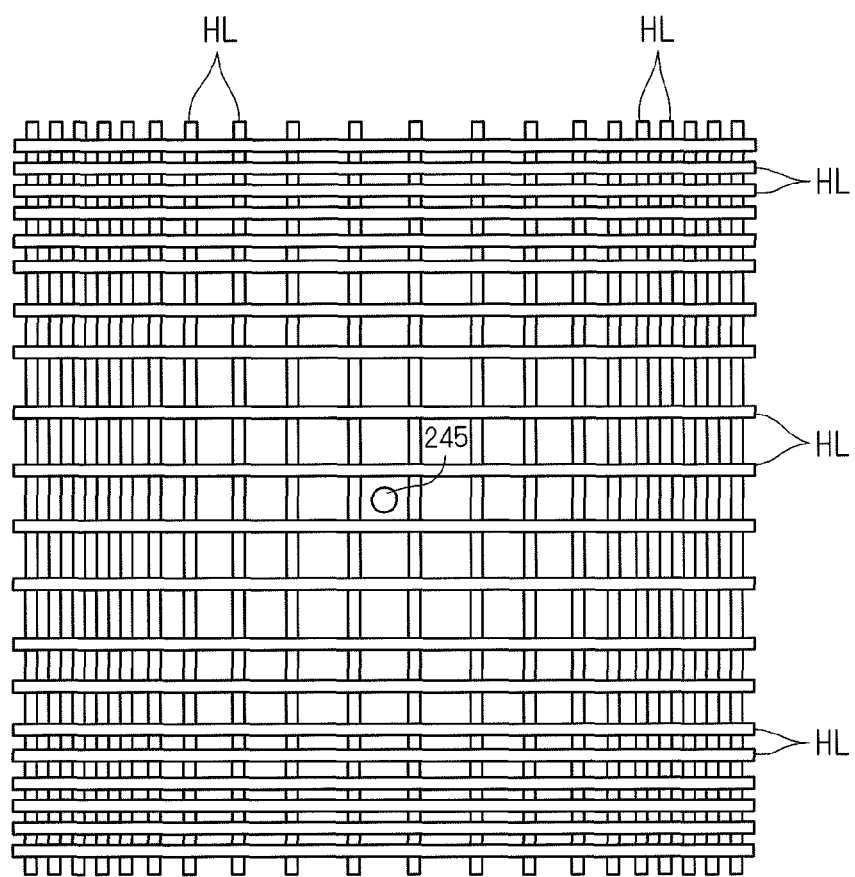

F I G . 2 2
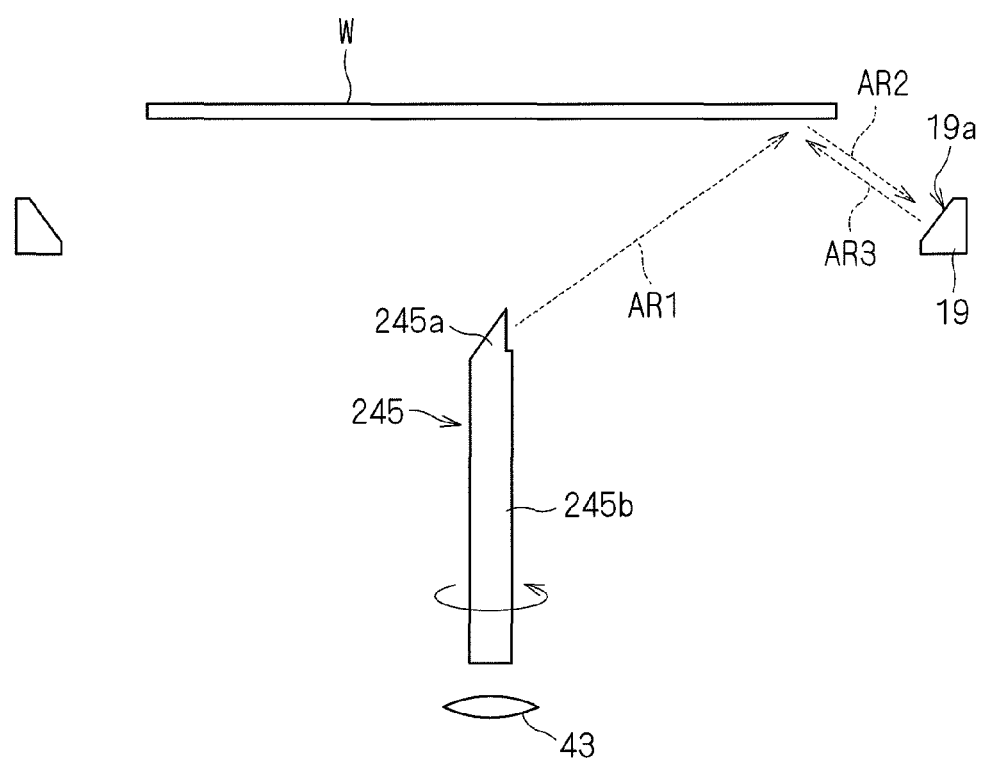

F I G. 2 3
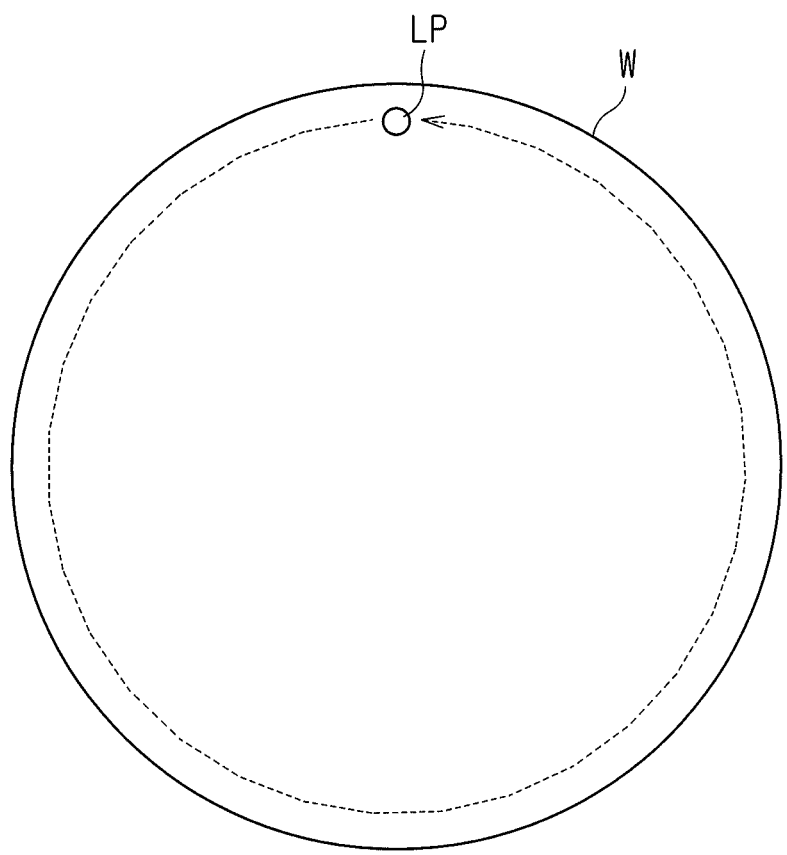

F I G . 2 4
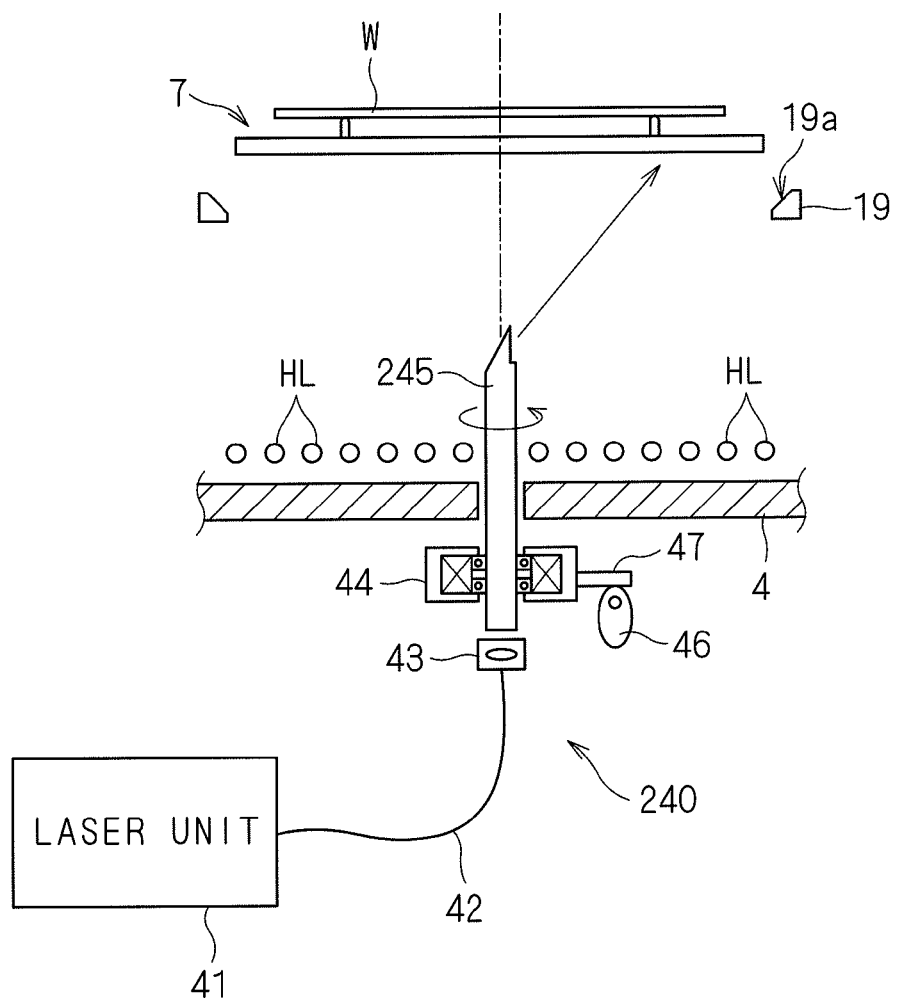

F I G. 2 7 A
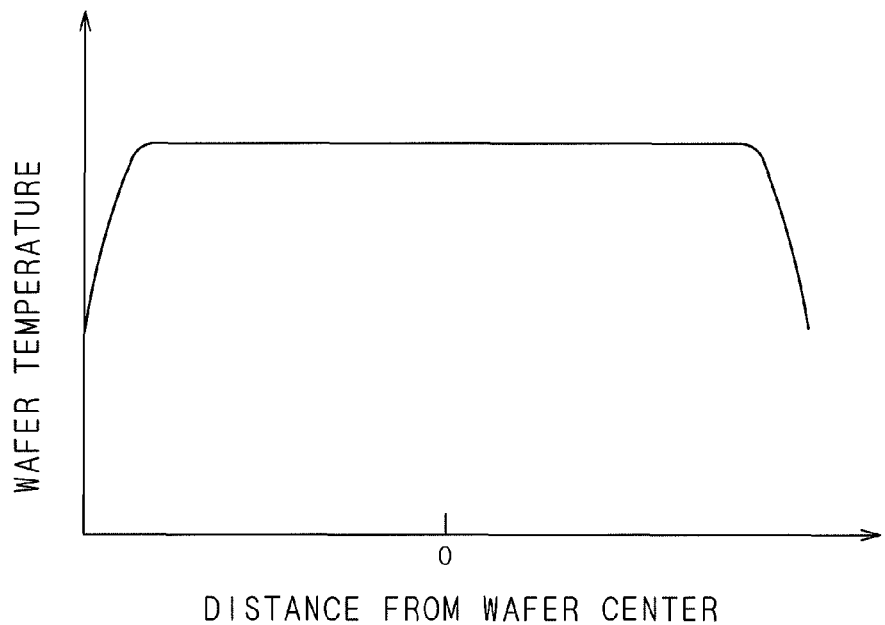
F I G. 2 7 B
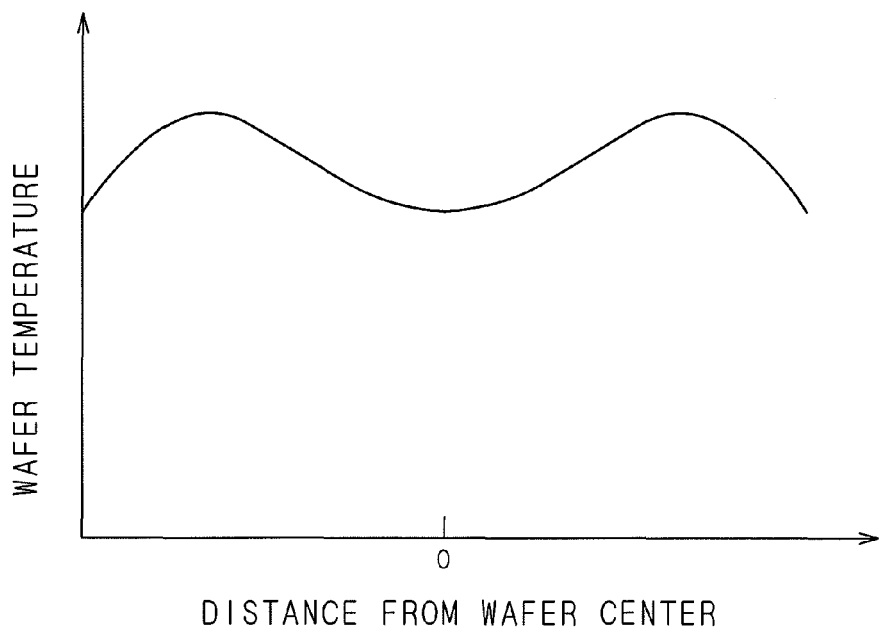

HEAT TREATMENT APPARATUS FOR HEATING SUBSTRATE BY IRRADIATING SUBSTRATE WITH FLASHES OF LIGHT

BACKGROUND OF THE INVENTION

1. Field of the Invention

The present invention relates to a heat treatment apparatus for heating a thin plate-like precision electronic substrate such as a semiconductor wafer and a glass substrate for a liquid crystal display device (hereinafter referred to simply as a "substrate") by irradiating the substrate with flashes of light.

2. Description of the Background Art

In the process of manufacturing a semiconductor device, impurity doping is an essential step for forming a pn junction in a semiconductor wafer. At present, it is common practice to perform impurity doping by an ion implantation process and a subsequent annealing process. The ion implantation process is a technique for causing ions of impurity elements such as boron (B), arsenic (As) and phosphorus (P) to collide against the semiconductor wafer with high acceleration voltage, thereby physically implanting the impurities into the semiconductor wafer. The implanted impurities are activated by the subsequent annealing process. When annealing time in this annealing process is approximately several seconds or longer, the implanted impurities are deeply diffused by heat. This results in a junction depth much greater than a required depth, which might present a problem in good device formation.

In recent years, attention has been given to flash lamp annealing (FLA) that is an annealing technique for heating a semiconductor wafer in an extremely short time. The flash lamp annealing is a heat treatment technique in which xenon flash lamps (the term "flash lamp" as used hereinafter refers to a "xenon flash lamp") are used to irradiate the surface of a semiconductor wafer with flashes of light, thereby raising the temperature of only the surface of the semiconductor wafer doped with impurities in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with flashes of light emitted from the xenon flash lamps, the temperature of the semiconductor wafer can be raised rapidly, with only a small amount of light transmitted through the semiconductor wafer. Also, it has turned out that the irradiation of a semiconductor wafer with flashes of light in an extremely short time of several milliseconds or less allows a selective temperature rise only near the surface of the semiconductor wafer. Therefore, the temperature rise in an extremely short time with the xenon flash lamps allows only the activation of impurities to be achieved without deep diffusion of the impurities.

Heat treatment apparatuses including such xenon flash lamps, in which pulsed light emitting lamps such as flash lamps are disposed on the front surface side of a semiconductor wafer and lamps that stay lit continuously such as halogen lamps are disposed on the back side thereof so that a desired heat treatment is performed using a combination of these lamps, are disclosed in U.S. Pat. No. 4,649,261 and International Publication No. WO 2003/085343. In these disclosed heat treatment apparatuses, the semiconductor wafer is preheated to a certain degree of temperature by the halogen lamps and the like, and is then raised in temperature to a desired treatment temperature by pulse heating from the flash lamps. Also, U.S. Patent Application Publication No. 2006/0291835 discloses an apparatus in which a semiconductor wafer placed on a hot plate is preheated to a predetermined temperature, and is then raised in temperature to a desired treatment temperature by irradiation with a flash of light from flash lamps.

When a semiconductor wafer is preheated by the hot plate as disclosed in U.S. Patent Application Publication No. 2006/0291835, a relatively uniform in-plane distribution of the wafer temperature is achieved by the precise temperature control of the hot plate. In particular, the hot plate disclosed in U.S. Patent Application Publication No. 2006/0291835 is divided into concentric zones which are individually temperature-controllable. This achieves the uniform in-plane distribution of the wafer temperature easily. On the other hand, the preheating using the halogen lamps as disclosed in U.S. Pat. No. 4,649,261 and International Publication No. WO 2003/085343 provides a process-related advantage in that the temperature of the semiconductor wafer is raised to a relatively high preheating temperature in a short time, but is prone to present a problem in that the temperature of a peripheral portion of the wafer is lower than that of a central portion thereof.

FIGS. 27A and 27B are graphs showing in-plane temperature distributions of a semiconductor wafer in a conventional heat treatment apparatus including flash lamps and preheating halogen lamps in combination. The graphs of FIGS. 27A and 27B show results obtained by preheating the semiconductor wafer implanted with impurities to a certain degree of temperature by the halogen lamps, irradiating the semiconductor wafer with flashes of light from the flash lamps to perform a pulse heating treatment, and then measuring a sheet resistance to determine a wafer temperature achieved. As shown in FIG. 27A, good temperature distribution uniformity is achieved in an inner region of the semiconductor wafer, rather than in a peripheral portion thereof, but the temperature falls rapidly in the peripheral portion.

When the amount of light directed from the halogen lamps onto the peripheral portion of the wafer for preheating is increased for the purpose of solving the problem of the temperature fall in the peripheral portion, the temperature of part of the peripheral portion rises, as shown in FIG. 27B, but the temperature distribution uniformity in the inner region, rather than in the peripheral portion, is impaired. Additionally, the temperature fall in an outermost edge portion of the semiconductor wafer still remains unsolved.

SUMMARY OF THE INVENTION

The present invention is intended for a heat treatment apparatus for heating a substrate by irradiating the substrate with flashes of light.

According to a first aspect of the present invention, the heat treatment apparatus comprises: a holder for holding a substrate in a horizontal position from below; a flash lamp for irradiating the substrate held by the holder with flashes of light from above; and an auxiliary irradiation part for directing light onto a local region of the substrate held by the holder which is lower in temperature than other regions of the substrate.

The heat treatment apparatus includes the auxiliary irradiation part which directs light onto a local region of the substrate held by the holder which is lower in temperature than other regions of the substrate. This raises the temperature of the local region to achieve a uniform in-plane temperature distribution throughout the substrate.

Preferably, the holder is made of quartz, and the heat treatment apparatus further comprises a halogen lamp for irradiating the substrate held by the holder with light from below to preheat the substrate.

The heat treatment apparatus includes the halogen lamp which irradiates the substrate held by the holder made of quartz with light from below to preheat the substrate. This eliminates the nonuniformity of the temperature distribution when the local region lower in temperature than other regions is produced by preheating.

Preferably, the laser light irradiation part includes a laser light emitting part disposed immediately under the center of the substrate held by the holder and configured to emit laser light toward a peripheral portion of the substrate, and a rotating part for rotating the laser light emitting part about the center line of the substrate.

This raises the temperature of the peripheral portion to achieve a uniform in-plane temperature distribution of the substrate, when the temperature of the peripheral portion of the substrate is lower than that of other regions.

Preferably, the laser light irradiation part further includes an elevating part for reciprocatingly upwardly and downwardly moving the laser light emitting part rotated by the rotating part.

This increases the width of a region irradiated with laser light in the peripheral portion of the substrate.

According to a second aspect of the present invention, the heat treatment apparatus comprises: a chamber for receiving a substrate; a holder for holding the substrate in a horizontal position from below within the chamber; a flash lamp for irradiating the substrate held by the holder with flashes of light from above; an auxiliary irradiation part for directing light onto a lower surface of a local region of the substrate held by the holder which is lower in temperature than other regions of the substrate; and a reflective part for further reflecting light directed from the auxiliary irradiation part and reflected from the lower surface of the substrate to cause the further reflected light to reach the local region.

The heat treatment apparatus includes the reflective part which further reflects light directed from the auxiliary irradiation part and reflected from the lower surface of the substrate to cause the further reflected light to reach the local region which is lower in temperature than other regions. This raises the temperature of the local region to achieve a uniform in-plane temperature distribution throughout the substrate.

Preferably, the light reflected from the lower surface of the substrate enters the reflective part at an incident angle of zero degrees.

This allows the reflected light to precisely reach the local region irradiated with light from the auxiliary irradiation part.

Preferably, the heat treatment apparatus further comprises an angle adjusting mechanism for adjusting an incident angle at which the light reflected from the lower surface of the substrate enters the reflective part.

This makes fine adjustments of the position reached by the reflected light from the reflective part to achieve a uniform in-plane temperature distribution of the substrate with higher accuracy.

Preferably, the reflective part is a mirror-finished portion of an inner wall surface of the chamber.

This eliminates the need to provide the space for placement of the purpose-built reflective part, and also simplifies the configuration of the heat treatment apparatus.

It is therefore an object of the present invention to provide a uniform in-plane temperature distribution of a substrate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a plan view of a holding plate;

FIG. 4 is an enlarged view of a bump and its vicinities when a semiconductor wafer is placed on the holding plate;

FIG. 5 is a plan view of a transfer mechanism;

FIG. 8 is a plan view showing an arrangement of halogen lamps;

FIG. 9 is a view showing a configuration of an auxiliary irradiation part according to the first preferred embodiment;

FIG. 10 is a view showing the holding plate that holds a semiconductor wafer;

FIG. 11 is a view showing an optical path of laser light in a laser light emitting part according to the first preferred embodiment;

FIG. 12 is a view showing a trajectory of an irradiation spot of laser light according to the first preferred embodiment;

FIG. 13 is a view showing a configuration of the auxiliary irradiation part according to a second preferred embodiment of the present invention;

FIG. 15 is a view showing a configuration of the auxiliary irradiation part according to a third preferred embodiment of the present invention;

FIG. 18 is a plan view showing an arrangement of the halogen lamps according to the fifth preferred embodiment;

FIG. 22 is a view showing the irradiation of a peripheral portion of a semiconductor wafer with laser light by the use of the auxiliary irradiation part and the reflective part according to the fifth preferred embodiment;

FIG. 23 is a view showing a trajectory of an irradiation spot of laser light according to the fifth preferred embodiment;

FIG. 24 is a view showing a configuration of the auxiliary irradiation part according to a sixth preferred embodiment of the present invention;

FIGS. 27A and 27B are graphs showing in-plane temperature distributions of a semiconductor wafer in a conventional heat treatment apparatus.

DESCRIPTION OF THE PREFERRED EMBODIMENTS

Preferred embodiments according to the present invention will now be described in detail with reference to the drawings.

<First Preferred Embodiment>

Figure 1:
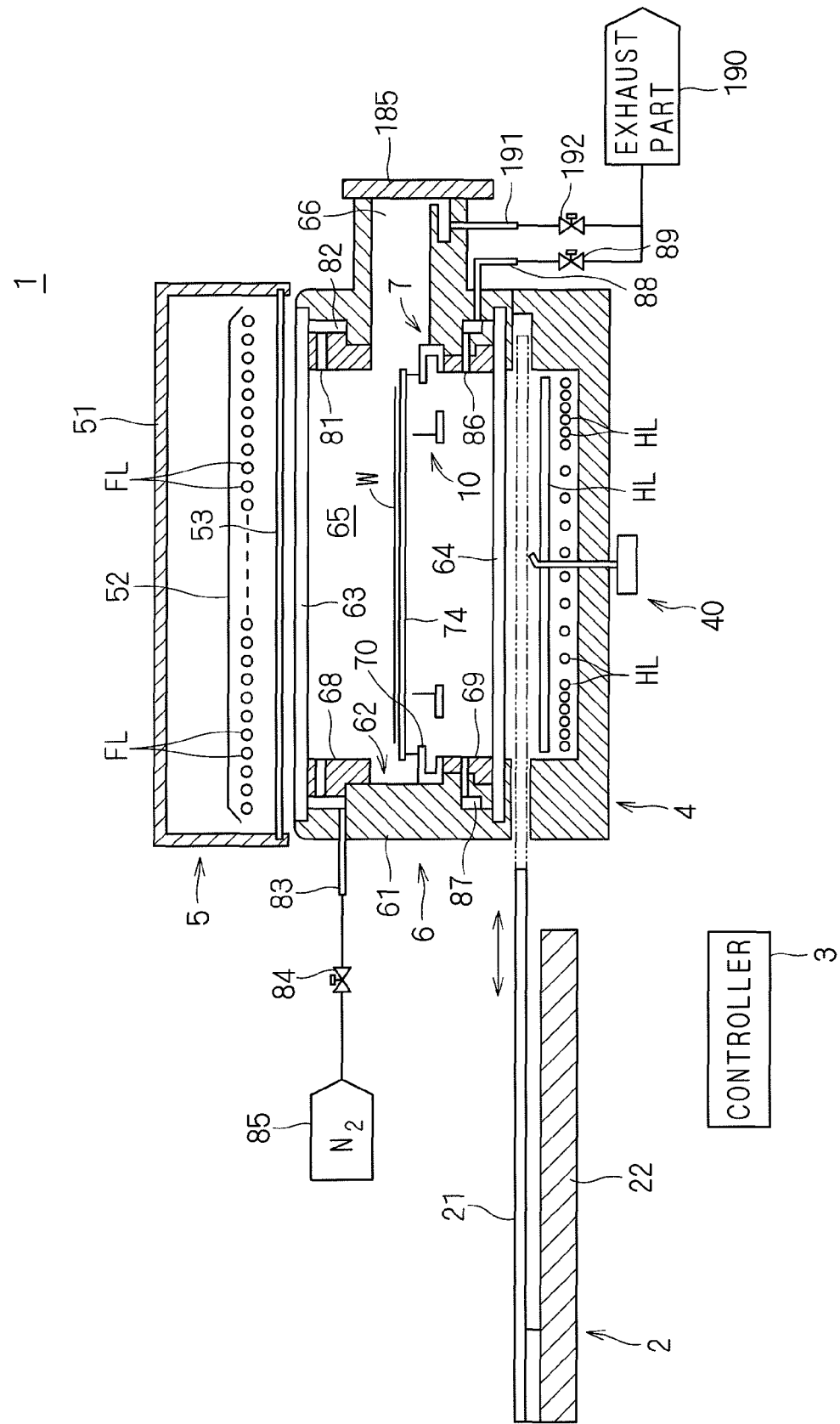
FIG. 1 is a longitudinal sectional view showing a configuration of a heat treatment apparatus according to a first preferred embodiment of the present invention.

FIG. 1 is a longitudinal sectional view showing a configuration of a heat treatment apparatus 1 according to a first preferred embodiment of the present invention. The heat treatment apparatus 1 according to the first preferred embodiment is a flash lamp annealer for irradiating a generally disk-shaped semiconductor wafer W having a diameter of 300 mm and serving as a substrate with flashes of light to heat the semiconductor wafer W. A semiconductor wafer W prior to the transport into the heat treatment apparatus 1 is implanted with impurities. The heat treatment apparatus 1 performs a heating treatment on the semiconductor wafer W to thereby activate the impurities implanted in the semiconductor wafer W.

The heat treatment apparatus 1 includes a chamber 6 for receiving a semiconductor wafer W therein, a flash heating part 5 including a plurality of built-in flash lamps FL, a halogen heating part 4 including a plurality of built-in halogen lamps HL, and a shutter mechanism 2. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal position, and a transfer mechanism 10 provided inside the chamber 6 and for transferring a semiconductor wafer W between the holder 7 and the outside of the heat treatment apparatus 1. The heat treatment apparatus 1 further includes a controller 3 for controlling operating mechanisms provided in the shutter mechanism 2, the halogen heating part 4, the flash heating part 5, and the chamber 6 to cause the operating mechanisms to heat-treat a semiconductor wafer W.

The chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 that holds a semiconductor wafer W.

The chamber side portion 61, and the upper and lower reflective rings 68 and 69 are made of, for example, a metal material (e.g., stainless steel) with high strength and high heat resistance. The inner peripheral surfaces of the upper and lower reflective rings 68 and 69 are provided as mirror surfaces by electrolytic nickel plating.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into the heat treatment space 65 and to be transported out of the heat treatment space 65. When the transport opening 66 is closed by the gate valve 185, the heat treatment space 65 in the chamber 6 is an enclosed space.

At least one gas supply opening 81 for supplying a treatment gas (in this preferred embodiment, nitrogen ($N_2$) gas) therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a nitrogen gas supply source 85. A valve 84 is inserted at some midpoint in the gas supply pipe 83. When the valve 84 is opened, nitrogen gas is fed from the nitrogen gas supply source 85 to the buffer space 82. The nitrogen gas flowing in the buffer space 82 flows in a spreading manner within the buffer space 82 which is lower in fluid resistance than the gas supply opening 81, and is supplied through the gas supply opening 81 into the heat treatment space 65.

On the other hand, at least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is inserted at some midpoint in the gas exhaust pipe 88. When the valve 89 is opened, a gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, which are arranged in a circumferential direction of the chamber 6, and may be in the form of slits. The nitrogen gas supply source 85 and the exhaust part 190 may be mechanisms provided in the heat treatment apparatus 1 or be utility systems in a factory in which the heat treatment apparatus 1 is installed.

A gas exhaust pipe 191 for exhausting a gas from the heat treatment space 65 is also connected to a distal end of the transport opening 66. The gas exhaust pipe 191 is connected through a valve 192 to the exhaust part 190. By opening the valve 192, a gas in the chamber 6 is exhausted through the transport opening 66.

Figure 2:
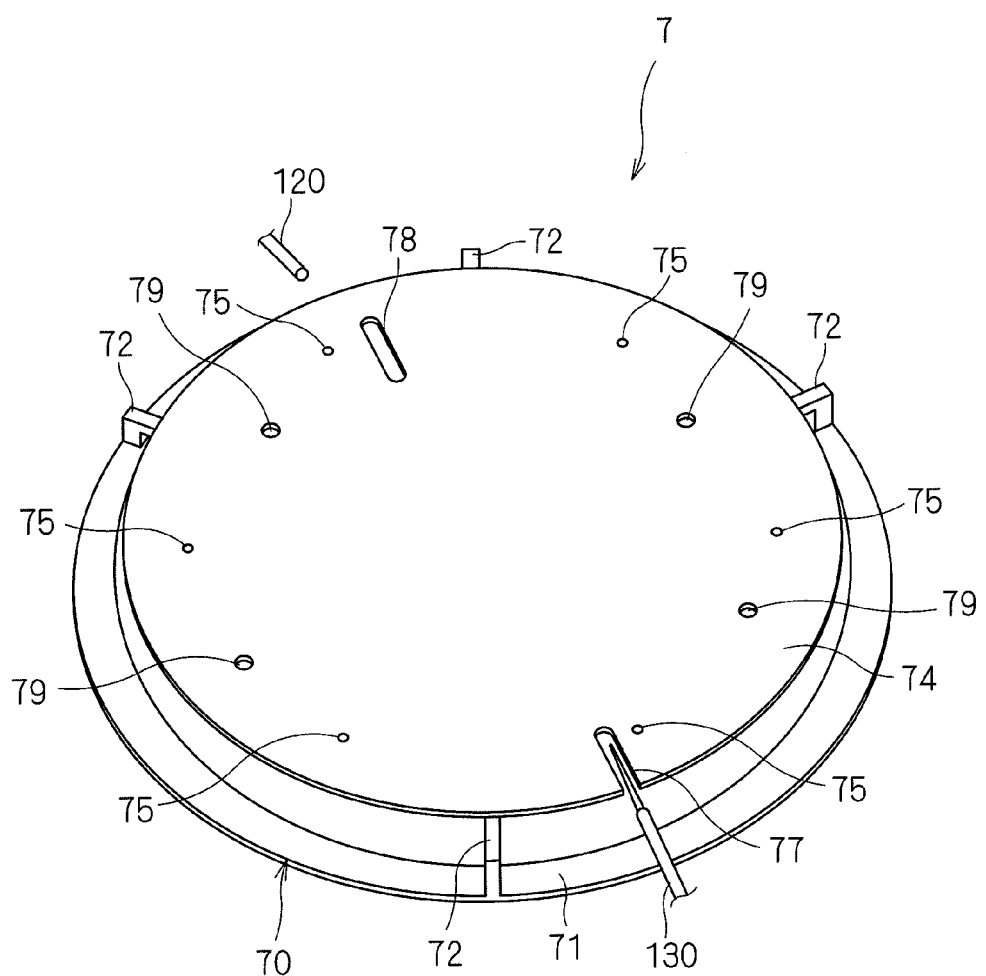
FIG. 2 is a perspective view of a holder.

FIG. 2 is a perspective view of the holder 7. The holder 7 includes a susceptor 70 and a holding plate 74. The susceptor 70 is made of quartz, and includes a ring part 71 in the form of an annular ring, and a plurality of lugs 72 (in this preferred embodiment, four lugs) mounted upright on the ring part 71. FIG. 3 is a plan view of the holding plate 74. The holding plate 74 is a circular planar member made of quartz. The diameter of the holding plate 74 is greater than that of a semiconductor wafer W. In other words, the holding plate 74 has a size, as seen in plan view, greater than that of the semiconductor wafer W. Multiple bumps 75 are mounted upright on the upper surface of the holding plate 74. In this preferred embodiment, a total of six bumps 75 spaced at intervals of 60 degrees are disposed upright along the circumference of a circle concentric with the outer circumference of the holding plate 74. The diameter of the circle on which the six bumps 75 are disposed (a distance between circumferentially opposed ones of the bumps 75) is less than the diameter of the semiconductor wafer W, and is 280 mm in this preferred embodiment. Each of the bumps 75 is a support pin made of quartz. It should be noted that the number of bumps 75 is not limited to six, but it is only necessary that at least three bumps 75 capable of supporting a semiconductor wafer W with stability are provided.

Multiple (in this preferred embodiment, five) guide pins 76 are mounted upright on the upper surface of the holding plate 74 concentrically with the six bumps 75. The diameter of a circle on which the five guide pins 76 are disposed is slightly greater than the diameter of the semiconductor wafer W. The guide pins 76 are made of quartz. An annular ring member having a tapered surface which forms a predetermined angle with a horizontal plane so as to flare upwardly may be provided in place of the multiple guide pins 76.

The ring part 71 is placed on the bottom surface of the recessed portion 62, whereby the susceptor 70 is mounted to the chamber 6. The holding plate 74 is placed on the lugs 72 of the susceptor 70 mounted to the chamber 6. A semiconductor wafer W transported into the chamber 6 is placed in a horizontal position on the holding plate 74 held by the susceptor 70.

FIG. 4 is an enlarged view of one of the bumps 75 and its vicinities when a semiconductor wafer W is placed on the holding plate 74. A support rod 73 is mounted upright on each of the lugs 72 of the susceptor 70. An upper end portion of the support rod 73 is fitted in a recessed portion provided in the lower surface of the holding plate 74, whereby the holding plate 74 is held by the susceptor 70 without misregistration.

Each of the bumps 75 and the guide pins 76 is fitted in a recessed portion provided in the upper surface of the holding plate 74 and is mounted upright thereon. The upper end of each of the bumps 75 and the guide pins 76 mounted upright on the upper surface of the holding plate 74 protrudes from the upper surface thereof. A semiconductor wafer W is placed on the holding plate 74 in such a manner as to be supported in point contacting relationship by the multiple bumps 75 mounted upright on the holding plate 74. A distance from the vertical position of the upper end of each of the bumps 75 to the upper surface of the holding plate 74 is in the range of 0.5 to 3 mm (in this preferred embodiment, 1 mm). Thus, the semiconductor wafer W is supported by the multiple bumps 75 at a distance ranging from 0.5 to 3 mm apart from the upper surface of the holding plate 74. The vertical position of the upper end of each of the guide pins 76 is higher than the vertical position of the upper end of each of the bumps 75. Thus, the multiple guide pins 76 prevent the horizontal misregistration of the semiconductor wafer W. The bumps 75 and the guide pins 76 may be made of quartz integrally with the holding plate 74.

When the annular ring member having the aforementioned tapered surface is provided in place of the guide pins 76, the annular ring member prevents the horizontal misregistration of the semiconductor wafer W. At least a region of the upper surface of the holding plate 74 which is opposed to the semiconductor wafer W supported by the multiple bumps 75 is a planar surface. In this case, the semiconductor wafer W is supported by the multiple bumps 75 at a distance ranging from 0.5 to 3 mm apart from the planar surface of the holding plate 74.

As shown in FIGS. 2 and 3, an opening 78 and a notch 77 are provided in the holding plate 74 so as to extend vertically through the holding plate 74. The notch 77 is provided to allow a distal end portion of a probe of a contact-type thermometer 130 including a thermocouple to pass therethrough. The opening 78, on the other hand, is provided for a radiation thermometer 120 to receive radiation (infrared radiation) emitted from the lower surface of the semiconductor wafer W held by the holding plate 74.

Figure 6:
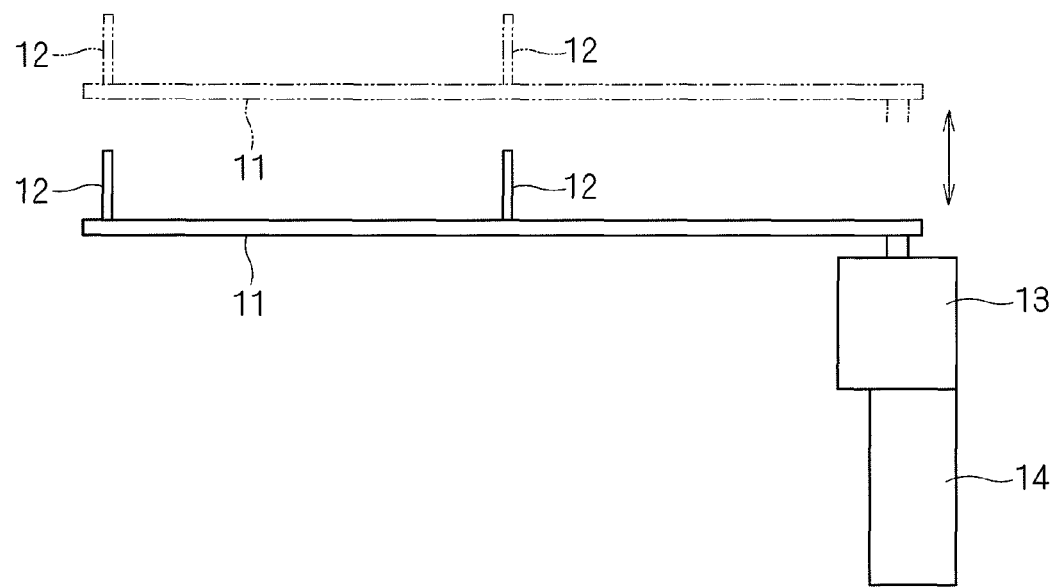
FIG. 6 is a side view of the transfer mechanism.

FIG. 5 is a plan view of the transfer mechanism 10. FIG. 6 is a side view of the transfer mechanism 10. The transfer mechanism 10 includes a pair of transfer arms 11. The transfer arms 11 are of an arcuate configuration extending substantially along the annular recessed portion 62. Each of the transfer arms 11 includes a pair of lift pins 12 mounted upright thereon. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through respective four through holes 79 (with reference to FIGS. 2 and 3) provided in the holding plate 74 so that the upper ends of the lift pins 12 protrude from the upper surface of the holding plate 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the ring part 71 of the susceptor 70. The retracted position of the transfer arms 11 is inside the recessed portion 62 because the ring part 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, the flash heating part 5 provided over the chamber 6 includes an enclosure 51, a light source provided inside the enclosure 51 and including the multiple (in this preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor portion of the flash heating part 5 is a plate-like quartz window made of quartz. The flash heating part 5 is provided over the chamber 6, whereby the lamp light radiation window 53 is opposed to the upper chamber window 63. The flash lamps FL direct flashes of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along the main surface of a semiconductor wafer W held by the holder 7 (that is, in a horizontal direction). Thus, a plane defined by the arrangement of the flash lamps FL is also a horizontal plane.

Figure 7:
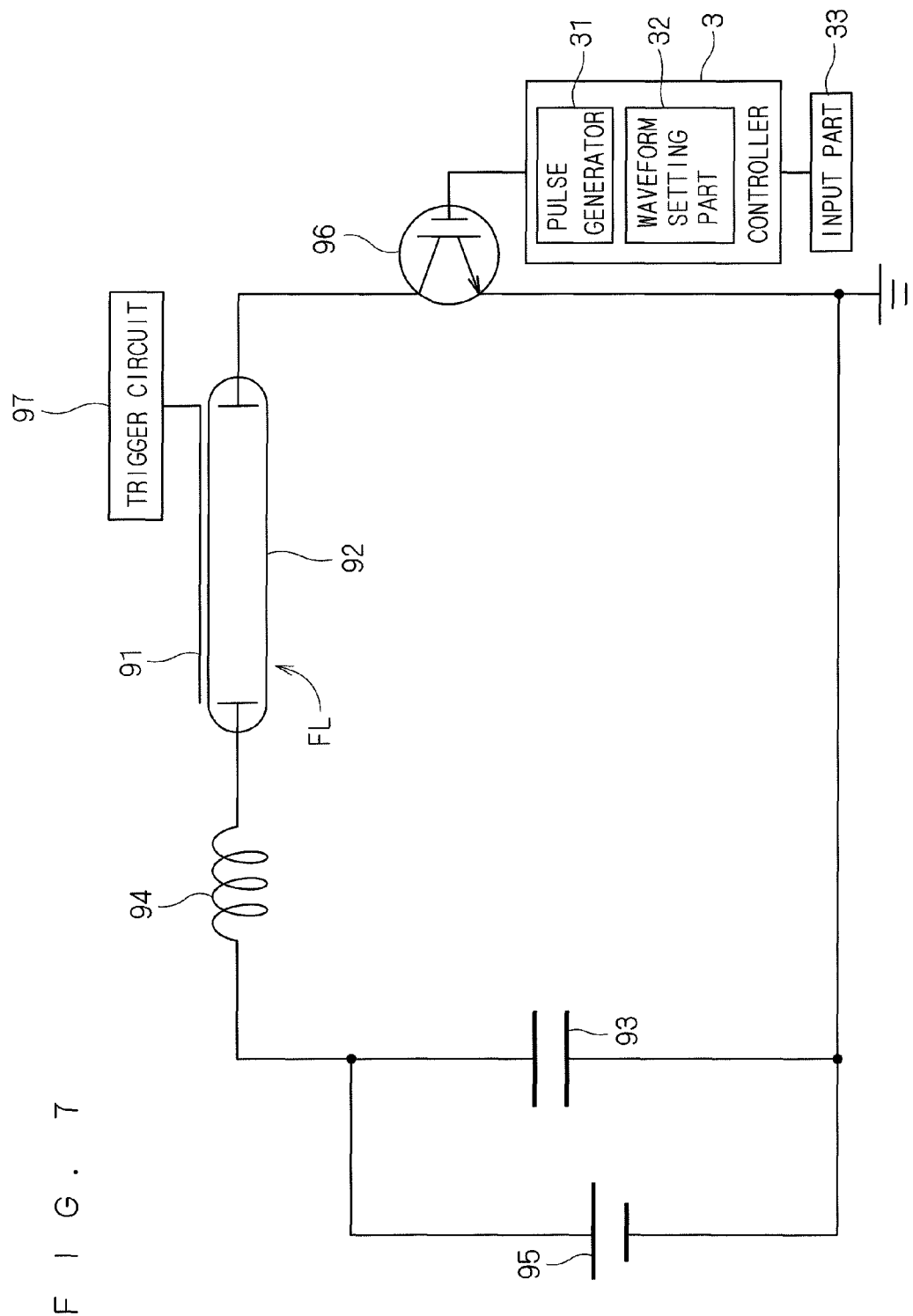
FIG. 7 is a diagram showing a driving circuit for a flash lamp.

FIG. 7 is a diagram showing a driving circuit for each flash lamp FL. As illustrated in FIG. 7, a capacitor 93, a coil 94, a flash lamp FL, and an IGBT (insulated-gate bipolar transistor) 96 are connected in series. Also as shown in FIG. 7, the controller 3 includes a pulse generator 31 and a waveform setting part 32, and is connected to an input part 33. Examples of the input part 33 used herein include various known input devices such as a keyboard, a mouse, and a touch panel. The waveform setting part 32 sets the waveform of a pulse signal, based on an input from the input part 33, and the pulse generator 31 generates the pulse signal in accordance with that waveform.

The flash lamp FL includes a rod-shaped glass tube (discharge tube) 92 containing xenon gas sealed therein and having positive and negative electrodes provided on opposite ends thereof, and a trigger electrode 91 attached to the outer peripheral surface of the glass tube 92. A power supply unit 95 applies a predetermined voltage to the capacitor 93, and the capacitor 93 is charged in accordance with the applied voltage. A trigger circuit 97 is capable of applying a high voltage to the trigger electrode 91. The timing of the voltage application from the trigger circuit 97 to the trigger electrode 91 is under the control of the controller 3.

The IGBT 96 is a bipolar transistor which includes a MOSFET (metal-oxide-semiconductor field-effect transistor) incorporated in the gate thereof, and is also a switching element suitable for handling a large amount of power. The pulse generator 31 in the controller 3 applies a pulse signal to the gate of the IGBT 96. When a voltage ("high" voltage) not less than a predetermined level is applied to the gate of the IGBT 96, the IGBT 96 turns ON. When a voltage ("low" voltage) less than the predetermined level is applied to the gate of the IGBT 96, the IGBT 96 turns OFF. In this manner, the driving circuit including the flash lamp FL is turned ON and OFF by the IGBT 96. By turning the IGBT 96 ON and OFF, the connection between the flash lamp FL and the capacitor 93 corresponding thereto is made and broken.

Even if, with the capacitor 93 in the charged state, the IGBT 96 turns ON to apply a high voltage across the electrodes of the glass tube 92, no electricity will flow through the glass tube 92 in a normal state because the xenon gas is electrically insulative. However, if the trigger circuit 97 applies a high voltage to the trigger electrode 91 to produce an electrical breakdown, an electrical discharge between the electrodes causes a current to flow momentarily in the glass tube 92, so that xenon atoms or molecules are excited at this time to cause light emission.

Also, the reflector 52 shown in FIG. 1 is provided over the plurality of flash lamps FL so as to cover all of the flash lamps FL. A fundamental function of the reflector 52 is to reflect the light emitted from the plurality of flash lamps FL toward the holder 7. The reflector 52 is a plate made of an aluminum alloy. A surface of the reflector 52 (a surface which faces the flash lamps FL) is roughened by abrasive blasting to produce a stain finish thereon.

The multiple (in this preferred embodiment, 40) halogen lamps HL are incorporated in the halogen heating part 4 provided under the chamber 6. The halogen lamps HL direct light from under the chamber 6 through the lower chamber window 64 toward the heat treatment space 65. FIG. 8 is a plan view showing an arrangement of the halogen lamps HL. In this preferred embodiment, 20 halogen lamps HL are arranged in an upper tier, and 20 halogen lamps HL are arranged in a lower tier. Each of the halogen lamps HL is a rod-shaped lamp having an elongated cylindrical shape. The 20 halogen lamps HL in the upper tier and the 20 halogen lamps HL in the lower tier are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 8, the halogen lamps HL in each of the upper and lower tiers are disposed at a higher density in a region opposed to the peripheral portion of the semiconductor wafer W held by the holder 7 than in a region opposed to the central portion thereof. In other words, the halogen lamps HL in each of the upper and lower tiers are arranged at shorter intervals near the ends of the lamp arrangement than in the central portion thereof. This allows a greater amount of light to impinge upon the peripheral portion of the semiconductor wafer W where a temperature fall is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the halogen lamps HL in the upper tier and the longitudinal direction of the halogen lamps HL in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. In addition, the halogen lamps HL, which are rod-shaped lamps, have a long life. The arrangement of the halogen lamps HL in a horizontal direction provides good efficiency of radiation to the semiconductor wafer W over the halogen lamps HL.

The heat treatment apparatus 1 according to the first preferred embodiment further includes an auxiliary irradiation part 40 provided under the holder 7. FIG. 9 is a view showing a configuration of the auxiliary irradiation part 40 according to the first preferred embodiment. In FIG. 9, the configurations of the halogen heating part 4 and the chamber 6 are shown in simplified form for convenience of illustration. The auxiliary irradiation part 40 includes a laser unit 41, a laser light emitting part 45, and a rotary motor 44. The laser unit 41 according to the first preferred embodiment is a very high power semiconductor laser which provides a power output of 80 to 120 W, and emits visible laser light having a wavelength of 800 to 820 nm. The laser light emitted from the laser unit 41 is guided through an optical fiber 42 to a lens 43. The laser light exiting the lens 43 enters the laser light emitting part 45.

The laser light emitting part 45 is a generally rod-shaped optical member made of quartz. The laser light emitting part 45 includes a light guiding part 45b extending in a vertical direction, and a light emitting part 45a extending in an obliquely upward direction. The laser light emitting part 45 is disposed immediately under the center of a semiconductor wafer W held by the holder 7. Specifically, the light guiding part 45b extends along a center line CX passing vertically through the center of the semiconductor wafer W held in a horizontal position by the holder 7, and the light emitting part 45a is provided on the upper end of the light guiding part 45b and extends obliquely upwardly.

The laser light emitting part 45 is rotatable about the center line CX of the semiconductor wafer W by the rotary motor 44 provided under the halogen heating part 4. The rotary motor 44 according to the present preferred embodiment is a hollow motor having a hollow motor shaft. The lower end of the light guiding part 45b is inserted through the hollow portion of the rotary motor 44. The lens 43 is disposed in a position opposed to the lower end surface of the light guiding part 45b.

The light guiding part 45b has an upper end portion extending through the bottom wall of the halogen heating part 4 and a reflector not shown for the halogen lamps HL. The light guiding part 45b may be provided with a bearing in a location where the light guiding part 45b passes through the bottom wall of the halogen heating part 4. The light guiding part 45b extends further through a gap between the arranged halogen lamps HL, and has an upper end provided at least above the halogen lamps HL in the upper tier. The light emitting part 45a is provided in continuation to the upper end of the light guiding part 45b so as to extend obliquely upwardly (at an angle of less than 90 degrees with respect to the center line CX). This prevents the light emitting part 45a and the halogen lamps HL from coming into contact with each other even when the laser light emitting part 45 rotates. It should be noted that the light emitting part 45a and the light guiding part 45b may be formed integrally with each other from a quartz member or be prepared as separate members which in turn are bonded together.

Laser light emitted from the laser unit 41 and coming through the lens 43 into the light guiding part 45b of the laser light emitting part 45 is reflected from the upper end of the light guiding part 45b, and is then directed from the light emitting part 45a toward a peripheral portion of the semiconductor wafer W held by the holder 7. The rotary motor 44 rotates the laser light emitting part 45 about the center line CX, thereby causing an irradiation spot of the laser light to swirl around along the peripheral portion of the semiconductor wafer W. The irradiation of the peripheral portion of the semiconductor wafer W with laser light by means of the auxiliary irradiation part 40 will be further described later.

Referring again to FIG. 1, the heat treatment apparatus 1 includes the shutter mechanism 2 provided alongside the halogen heating part 4 and the chamber 6. The shutter mechanism 2 includes a shutter plate 21, and a sliding drive mechanism 22. The shutter plate 21 is a plate opaque to halogen light (light from a halogen light source), and is made of titanium (Ti), for example. The sliding drive mechanism 22 causes the shutter plate 21 to slidably move in a horizontal direction, thereby bringing the shutter plate 21 into and out of a light shielding position lying between the halogen heating part 4 and the holder 7. When the sliding drive mechanism 22 moves the shutter plate 21 forward, the shutter plate 21 is inserted into the light shielding position (a position indicated by dash-double-dot lines in FIG. 1) lying between the chamber 6 and the halogen heating part 4 to provide isolation between the lower chamber window 64 and the plurality of halogen lamps HL. Thus, light directed from the plurality of halogen lamps HL toward the holder 7 in the heat treatment space 65 is intercepted. On the other hand, when the sliding drive mechanism 22 moves the shutter plate 21 backward, the shutter plate 21 is retracted from the light shielding position lying between the chamber 6 and the halogen heating part 4 to open the space lying under the lower chamber window 64. It should be noted that the laser light emitting part 45 is placed so that the vertical position of the light emitting part 45a is below the light shielding position of the shutter plate 21. Thus, the laser light emitting part 45 does not obstruct the forward and backward movement of the shutter plate 21.

The controller 3 controls the aforementioned various operating mechanisms provided in the heat treatment apparatus 1. The controller 3 is similar in hardware configuration to a typical computer. Specifically, the controller 3 includes a CPU for performing various computation processes, a ROM or read-only memory for storing a basic program therein, a RAM or readable/writable memory for storing various pieces of information therein, and a magnetic disk for storing control software, data and the like therein. The CPU in the controller 3 executes a predetermined processing program, whereby the processes in the heat treatment apparatus 1 proceed. Also, as shown in FIG. 7, the controller 3 includes the pulse generator 31 and the waveform setting part 32. As mentioned earlier, the waveform setting part 32 sets the waveform of a pulse signal, based on an input from the input part 33, and the pulse generator 31 outputs the pulse signal to the gate of the IGBT 96 in accordance with that waveform.

The heat treatment apparatus 1 further includes, in addition to the aforementioned components, various cooling structures to prevent an excessive temperature rise in the halogen heating part 4, the flash heating part 5 and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Next, a procedure for the treatment of a semiconductor wafer W in the heat treatment apparatus 1 will be described. A semiconductor wafer W to be treated herein is a semiconductor substrate doped with impurities (ions) by an ion implantation process. The impurities are activated by the heat treatment apparatus 1 performing the process of heating (annealing) the semiconductor wafer W by irradiation with flashes of light. The procedure for the treatment in the heat treatment apparatus 1 which will be described below proceeds under the control of the controller 3 over the operating mechanisms of the heat treatment apparatus 1.

First, the valve 84 is opened for supply of gas, and the valves 89 and 192 for exhaust of gas are opened, so that the supply and exhaust of gas into and out of the chamber 6 start. When the valve 84 is opened, nitrogen gas is supplied through the gas supply opening 81 into the heat treatment space 65. When the valve 89 is opened, the gas within the chamber 6 is exhausted through the gas exhaust opening 86. This causes the nitrogen gas supplied from an upper portion of the heat treatment space 65 in the chamber 6 to flow downwardly and then to be exhausted from a lower portion of the heat treatment space 65.

The gas within the chamber 6 is exhausted also through the transport opening 66 by opening the valve 192. Further, the exhaust mechanism not shown exhausts an atmosphere near the drivers of the transfer mechanism 10. It should be noted that the nitrogen gas is continuously supplied into the heat treatment space 65 during the heat treatment of a semiconductor wafer W in the heat treatment apparatus 1. The amount of nitrogen gas supplied into the heat treatment space 65 is changed as appropriate in accordance with processing steps.

Subsequently, the gate valve 185 is opened to open the transport opening 66. A transport robot outside the heat treatment apparatus 1 transports an ion-implanted semiconductor wafer W through the transport opening 66 into the heat treatment space 65 in the chamber 6. The semiconductor wafer W transported into the heat treatment space 65 by the transport robot is moved forward to a position lying immediately over the holder 7 and is stopped thereat. Then, the pair of transfer arms 11 of the transfer mechanism 10 are moved horizontally from the retracted position to the transfer operation position and are then moved upwardly, whereby the lift pins 12 pass through the through holes 79 and protrude from the upper surface of the holding plate 74 to receive the semiconductor wafer W.

After the semiconductor wafer W is placed on the lift pins 12, the transport robot moves out of the heat treatment space 65, and the gate valve 185 closes the transport opening 66. Then, the pair of transfer arms 11 move downwardly to transfer the semiconductor wafer W from the transfer mechanism 10 to the holding plate 74 of the holder 7, so that the semiconductor wafer W is held in a horizontal position from below. FIG. 10 is a view showing the holding plate 74 that holds the semiconductor wafer W. The semiconductor wafer W is supported by the six bumps 75 in point contacting relationship, and is held at a distance ranging from 0.5 to 3 mm (in this preferred embodiment, 1 mm) from the upper surface of the holding plate 74. Thus, a layer of gas having a thickness of 1 mm is sandwiched between the lower surface of the semiconductor wafer W and the upper surface of the holding plate 74. The pair of transfer arms 11 moved downwardly below the holding plate 74 are moved back to the retracted position, i.e. to the inside of the recessed portion 62, by the horizontal movement mechanism 13.

After the semiconductor wafer W is held in a horizontal position from below by the holder 7 made of quartz, the 40 halogen lamps HL in the halogen heating part 4 turn on simultaneously. Halogen light emitted from the halogen lamps HL is transmitted through the lower chamber window 64 and the holding plate 74 both made of quartz, and impinges upon the back surface of the semiconductor wafer W. The semiconductor wafer W which is irradiated with the halogen light from the halogen lamps HL is preheated, so that the temperature of the semiconductor wafer W rises. It should be noted that the transfer arms 11 of the transfer mechanism 10, which are retracted to the inside of the recessed portion 62, do not become an obstacle to the heating using the halogen lamps HL.

During the preheating using the halogen lamps HL, the temperature of the semiconductor wafer W is measured with the contact-type thermometer 130. Specifically, the contact-type thermometer 130 incorporating a thermocouple comes through the notch 77 of the holding plate 74 into contact with the lower surface of the semiconductor wafer W held by the holder 7 to measure the temperature of the semiconductor wafer W which is on the increase. The measured temperature of the semiconductor wafer W is transmitted to the controller 3. The controller 3 monitors whether the temperature of the semiconductor wafer W which is on the increase by the irradiation with halogen light from the halogen lamps HL reaches a predetermined preheating temperature T1 or not. The preheating temperature T1 shall be on the order of 200 to 800° C., preferably on the order of 350 to 600° C., (in the present preferred embodiment, 600° C.) at which there is no apprehension that the impurities implanted in the semiconductor wafer W are diffused by heat. It should be noted that, when the temperature of a semiconductor wafer W is raised by the irradiation with halogen light from the halogen lamps HL, the temperature is not measured with the radiation thermometer 120. This is because the halogen light emitted from the halogen lamps HL enters the radiation thermometer 120 in the form of disturbance light to obstruct the precise measurement of the temperature.

A semiconductor wafer W during the preheating shows a tendency to be lower in temperature in a peripheral portion thereof, as compared with the temperature in a central portion thereof. Conceivable causes of such a phenomenon include heat radiation from the peripheral portion of the semiconductor wafer W, convection occurring between the holding plate 74 which is relatively low in temperature and the vicinity of the peripheral portion of the semiconductor wafer W, and heat conduction from the peripheral portion of the semiconductor wafer W to the holding plate 74.

To prevent such a phenomenon, the halogen lamps HL in the halogen heating part 4 are disposed at a higher density in a region opposed to the peripheral portion of the semiconductor wafer W than in a region opposed to the central portion thereof, so that a greater amount of light is directed toward the peripheral portion of the semiconductor wafer W than toward the central portion thereof. Additionally, the inner peripheral surface of the lower reflective ring 69 mounted to the chamber side portion 61 is provided as a mirror surface. Thus, a greater amount of light is reflected from the inner peripheral surface of the lower reflective ring 69 toward the peripheral portion of the semiconductor wafer W.

Even though the amount of halogen light impinging upon the peripheral portion of the semiconductor wafer W is made greater than that impinging upon the central portion thereof, it has still been difficult to solve the problem of the decrease in the temperature of the peripheral portion of the semiconductor wafer W. This tendency becomes more pronounced as a distance between the halogen lamps HL and the semiconductor wafer W held by the holder 7 increases. Also, further increase in the amount of light directed from the halogen heating part 4 onto the peripheral portion of the semiconductor wafer W might further impair the uniformity of the in-plane temperature distribution as shown in FIG. 27B.

To solve such a problem, the auxiliary irradiation part 40 for additionally irradiating the peripheral portion of the semiconductor wafer W held by the holder 7 with light is provided in the first preferred embodiment. The laser unit 41 in the auxiliary irradiation part 40 emits visible laser light having a wavelength of 800 to 820 nm with a power output of 80 to 120 W. The laser light emitted from the laser unit 41 and guided through the optical fiber 42 to the lens 43 comes through the lens 43 into the light guiding part 45b of the laser light emitting part 45.

FIG. 11 is a view showing an optical path of laser light in the laser light emitting part 45 according to the first preferred embodiment. The laser light exits the lens 43 vertically upwardly, and enters the lower end surface of the light guiding part 45b perpendicularly thereto. In the light guiding part 45b extending in a vertical direction, the incoming laser light travels in a straight line vertically upwardly, i.e., along the length of the light guiding part 45b. The laser light traveling in a straight line vertically upwardly is totally reflected from an inclined surface 45c provided at the upper end of the light guiding part 45b, so that the optical path of the laser light is bent obliquely upwardly. As indicated by a dotted line in FIG. 11, the laser light is reflected so as to be directed toward the peripheral portion of the semiconductor wafer W held by the holder 7. The laser light totally reflected from the inclined surface 45c exits the light emitting part 45a toward the peripheral portion of the semiconductor wafer W held by the holder 7.

The visible laser light having a wavelength of 800 to 820 nm and exiting the light emitting part 45a of the laser light emitting part 45 is transmitted through the holder 7 made of quartz, and reaches the peripheral portion of the back surface of the semiconductor wafer W. On the other hand, the semiconductor wafer W made of silicon which is raised in temperature to a certain degree by the halogen heating part 4 absorbs the laser light having a wavelength of 800 to 820 nm. Thus, the laser light exiting the laser light emitting part 45 is directed onto and absorbed by the peripheral portion of the semiconductor wafer W to raise the temperature of the irradiated region of the semiconductor wafer W.

In the first preferred embodiment, the rotary motor 44 rotates the laser light emitting part 45 about the center line CX of the semiconductor wafer W as indicated by the arrow AR9 in FIG. 9, while the laser light is directed from the laser light emitting part 45 toward the peripheral portion of the semiconductor wafer W. As a result, an irradiation spot LP of the laser light exiting the laser light emitting part 45 swirls around along the peripheral portion of the back surface of the semiconductor wafer W so as to draw a circular trajectory as shown in FIG. 12. It should be noted that the rotary motor 44 causes the laser light emitting part 45 to make 5 to 200 rotations per second (in the present preferred embodiment, 20 rotations per second).

Thus, the laser light is directed onto the peripheral portion of the semiconductor wafer W where a relative temperature decrease has occurred in a preheating stage to raise the temperature of the peripheral portion, thereby improving the uniformity of the in-plane temperature distribution. The start of the irradiation with laser light from the laser light emitting part 45 may be timed to coincide with the turning on of the halogen lamps HL or to be a predetermined time period later than the turning on of the halogen lamps HL.

The flash lamps FL emit flashes of light at the point in time when a predetermined time period has elapsed since the temperature of the semiconductor wafer W reached the preheating temperature T1. For the emission of flashes of light from the flash lamps FL, the capacitor 93 is charged in advance by the power supply unit 95. Then, with the capacitor 93 in the charged state, the pulse generator 31 in the controller 3 outputs a pulse signal to the IGBT 96.

The waveform of the pulse signal outputted from the pulse generator 31 is specified by inputting from the input part 33 a recipe that is a sequence of defined parameters including a time interval (ON time) equivalent to the pulse width and a time interval (OFF time) between pulses. After an operator inputs the recipe containing descriptions of such parameters from the input part 33 to the controller 3, the waveform setting part 32 in the controller 3 sets a pulse waveform having repeated ON and OFF time intervals in accordance with the recipe. Then, the pulse generator 31 outputs the pulse signal in accordance with the pulse waveform set by the waveform setting part 32. As a result, the pulse signal having the waveform including the repeated ON and OFF time intervals is applied to the gate of the IGBT 96, so that the turning ON and OFF of the IGBT 96 are controlled.

In synchronism with the turning ON of the pulse signal outputted from the pulse generator 31, the controller 3 controls the trigger circuit 97 to apply a high voltage to the trigger electrode 91. Thus, when the pulse signal inputted to the gate of the IGBT 96 is ON, a current inevitably flows across the electrodes of the glass tube 92, and the resultant excitation of xenon atoms or molecules induces light emission. The controller 3 outputs the pulse signal to the gate of the IGBT 96, and also applies the trigger voltage to the trigger electrode 91 in synchronization with the turning ON of the pulse signal, thereby producing a flow of current having a sawtooth waveform in the circuit including a flash lamp FL. In other words, the value of the current flowing through the glass tube 92 of the flash lamp FL increases when the pulse signal inputted to the gate of the IGBT 96 is ON, and the current value decreases when the pulse signal is OFF. It should be noted that an individual current waveform corresponding to each pulse is defined by the constant of the coil 94.

The flow of a current in the circuit including the flash lamp FL causes the flash lamp FL to emit light. The emission intensity of the flash lamp FL is roughly proportional to the current flowing through the flash lamp FL. As a result, the waveform of the emission intensity of the flash lamp FL versus time is close to a sawtooth waveform. The semiconductor wafer W held by the holder 7 is irradiated with flashes of light in accordance with such an intensity waveform.

If a flash lamp FL emits light without using a switching element such as the IGBT 96, the electrical charges stored in the capacitor 93 are consumed momentarily by emitting light only once, so that the waveform of the emission intensity of the flash lamp FL exhibits a single pulse having a width on the order of 0.1 to 10 milliseconds between a rapid rising edge and a rapid falling edge.

On the other hand, when the IGBT 96 is connected in the circuit and the pulse signal is outputted to the gate of the IGBT 96 as in the present preferred embodiment, this circuit is turned ON and OFF intermittently by the IGBT 96, so that the current flowing from the capacitor 93 to the flash lamp FL is chopper-controlled. As a result, the light emission from the flash lamp FL is accordingly chopper-controlled, which allows the electrical charges stored in the capacitor 93 to be discharged intermittently and consumed in a divided manner at the flash lamp FL. This enables the flash lamp FL to repeatedly flash ON and OFF in an extremely short time. It should be noted that, before the value of the current flowing through the flash lamp FL reaches exactly zero, the next pulse is applied to the gate of the IGBT 96 to increase the current value again. For this reason, the emission intensity never reaches exactly zero even while the flash lamp FL repeatedly flashes ON and OFF.

The waveform of the emission intensity of the flash lamp FL versus time may be appropriately changed by adjusting the waveform of the pulse signal applied to the gate of the IGBT 96. The waveform of the emission intensity versus time may be determined in accordance with the purpose of the flash heating treatment (e.g., the activation of implanted impurities, and the process of recovering crystal defects created during impurity implantation). It should, however, be noted that the total light emission time of the flash lamp FL for a single heating treatment is not greater than one second, no matter what configuration the waveform of the emission intensity of the flash lamp FL versus time has. The waveform of the pulse signal applied to the gate of the IGBT 96 is adjustable by the time interval equivalent to the pulse width and the time interval between pulses, which are inputted from the input part 33.

The irradiation of the semiconductor wafer W with flashes of light from the flash lamps FL in this manner causes the surface temperature of the semiconductor wafer W to increase slowly from the preheating temperature T1 to an intended treatment temperature T2, and then to decrease slowly. However, the surface temperature of the semiconductor wafer W can be said to increase slowly and then to decrease slowly, as compared with that obtained by conventional flash lamp annealing, and the light emission time of the flash lamps FL is not greater then one second. Thus, the increase and decrease in the surface temperature according to this preferred embodiment occur in a significantly short time, as compared with those caused by the heating by irradiation with light using halogen lamps and the like. In the first preferred embodiment, the in-plane temperature distribution of the semiconductor wafer W is made uniform in the preheating stage by the irradiation of the semiconductor wafer W with the laser light from the laser light emitting part 45. This makes the in-plane temperature distribution of the surface of the semiconductor wafer W also uniform during the irradiation with flashes of light.

After a predetermined time period has elapsed since the completion of the flash heating treatment, the halogen lamps HL turn off. The irradiation with the laser light from the auxiliary irradiation part 40 also stops. This increases the speed at which the temperature of the semiconductor wafer W decreases. At the same time that the halogen lamps HL turn off, the shutter mechanism 2 inserts the shutter plate 21 into the light shielding position lying between the halogen heating part 4 and the chamber 6. The temperatures of filaments and tube walls of the halogen lamps HL do not decrease immediately after the halogen lamps HL turn off, but radiant heat is continuously emitted from the filaments and the tube walls at elevated temperature for a short time interval to obstruct the temperature decrease of the semiconductor wafer W. The insertion of the shutter plate 21 interrupts the radiant heat emitted from the halogen lamps HL immediately after the turning off toward the heat treatment space 65 to increase the speed at which the temperature of the semiconductor wafer W decreases.

After the temperature of the semiconductor wafer W decreases to a predetermined temperature or below, the pair of transfer arms 11 of the transfer mechanism 10 are moved horizontally again from the retracted position to the transfer operation position and are then moved upwardly, whereby the lift pins 12 protrude from the upper surface of the holding plate 74 to receive the heat-treated semiconductor wafer W from the holding plate 74. Subsequently, the transport opening 66 which has been closed is opened by the gate valve 185, and the transport robot outside the heat treatment apparatus 1 transports the semiconductor wafer W placed on the lift pins 12 to the outside. Thus, the heat treatment apparatus 1 completes the heating treatment of the semiconductor wafer W.

In the first preferred embodiment, the auxiliary irradiation part 40 irradiates a semiconductor wafer W with laser light to correct the nonuniformity of the in-plane temperature distribution of the semiconductor wafer W resulting from the preheating from the halogen lamps HL. When a semiconductor wafer W held by the holder 7 is preheated by the halogen lamps HL, the semiconductor wafer W shows a tendency to be lower in temperature in a peripheral portion thereof than in a central portion thereof. The irradiation of the peripheral portion with laser light from the auxiliary irradiation part 40 selectively heats the peripheral portion to achieve a uniform in-plane temperature distribution of the semiconductor wafer W.

In particular, the laser light emitting part 45 is rotated about the center line CX of the semiconductor wafer W in the first preferred embodiment, while the laser light is directed from the laser light emitting part 45 disposed immediately under the center of the semiconductor wafer W held by the holder 7 toward the peripheral portion of the semiconductor wafer W. Thus, the irradiation spot LP of the laser light exiting the laser light emitting part 45 swirls around along the peripheral portion of the back surface of the semiconductor wafer W so as to draw a circular trajectory. As a result, the entire peripheral portion of the semiconductor wafer W at lowered temperature is uniformly heated. This achieves a uniform in-plane temperature distribution of the semiconductor wafer W.

The heat treatment apparatus 1 according to the present invention includes the three types of heat sources of light irradiation type. Specifically, the heat treatment apparatus 1 includes the flash lamps FL which perform flash heating for the activation of impurities, the halogen lamps HL for preheating a semiconductor wafer W prior to the irradiation with flashes of light, and the auxiliary irradiation part 40 which irradiates the peripheral portion of the semiconductor wafer W with laser light. The irradiation with the laser light from the auxiliary irradiation part 40 is performed to compensate for the decrease in temperature of the peripheral portion of the semiconductor wafer W which is inevitably caused when only the amount of light from the halogen lamps HL is adjusted. This improves the uniformity of the in-plane temperature distribution of the semiconductor wafer W in the preheating stage to consequently finally achieve the uniform in-plane temperature distribution of the semiconductor wafer W during the irradiation with flashes of light.

<Second Preferred Embodiment>

Next, a second preferred embodiment according to the present invention will be described. FIG. 13 is a view showing a configuration of the auxiliary irradiation part 40 according to the second preferred embodiment. Like reference numerals and characters are used in FIG. 13 to designate components identical with those in FIG. 9. The auxiliary irradiation part 40 according to the second preferred embodiment includes a cam mechanism in addition to the components of the first preferred embodiment. Specifically, the auxiliary irradiation part 40 according to the second preferred embodiment includes a cam-follower 47 fixedly provided on the rotary motor 44, and a cam 46 abutting against the cam-follower 47. The configuration of the heat treatment apparatus 1 according to the second preferred embodiment is similar to that according to the first preferred embodiment except that the auxiliary irradiation part 40 includes the cam mechanism. A procedure for the treatment of a semiconductor wafer W in the heat treatment apparatus 1 according to the second preferred embodiment is also generally similar to that according to the first preferred embodiment.

The cam 46 is rotated by a rotary drive mechanism not shown, and the center of rotation of the cam 46 is eccentric. Thus, a distance from the center of rotation of the cam 46 to the point of contact between the cam-follower 47 and the cam 46 is periodically varied as the cam 46 is rotated. The rotation of the cam 46 moves the cam-follower 47 upwardly and downwardly to consequently move the laser light emitting part 45 reciprocatingly in a vertical direction.

Figure 14:
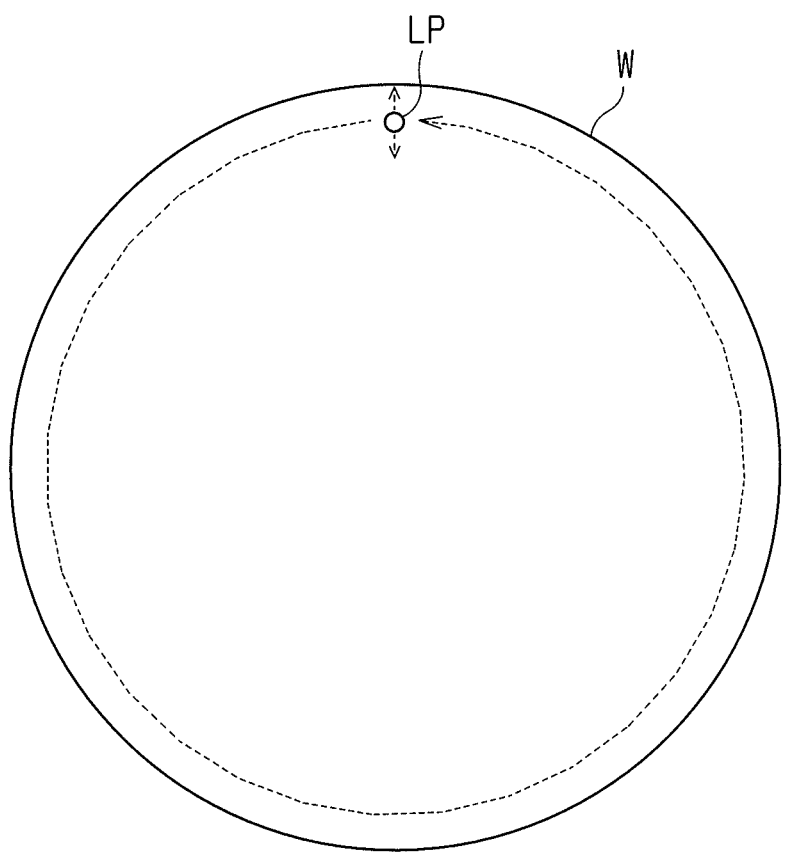
FIG. 14 is a view showing a trajectory of an irradiation spot of laser light according to the second preferred embodiment.

In the second preferred embodiment, the rotary motor 44 rotates the laser light emitting part 45 about the center line CX of the semiconductor wafer W as indicated by the arrow AR9 in FIG. 13, while laser light is directed from the laser light emitting part 45 toward the peripheral portion of the semiconductor wafer W. At the same time, the laser light emitting part 45 rotated by the rotary motor 44 is moved reciprocatingly in a vertical direction by the cam 46 and the cam-follower 47, as indicated by the arrow AR13 in FIG. 13. The upward and downward movement of the laser light emitting part 45 which directs laser light obliquely upwardly causes the position reached by the laser light on the back surface of the semiconductor wafer W to move reciprocatingly in a radial direction. As a result, the irradiation spot LP of the laser light exiting the laser light emitting part 45 swirls around along the peripheral portion of the back surface of the semiconductor wafer W so as to draw a substantially circular trajectory, and also moves reciprocatingly in the radial direction of the semiconductor wafer W, as shown in FIG. 14. In other words, the irradiation spot LP of the laser light draws a substantially circular trajectory while meandering in the peripheral portion of the back surface of the semiconductor wafer W.

This allows the swirling trajectory of the irradiation spot LP of the laser light in the peripheral portion of the semiconductor wafer W to have a width, as compared with the first preferred embodiment. The irradiation spot LP of the laser light itself has a circular or elliptic shape having a diameter on the order of several millimeters. Reciprocatingly moving the irradiation spot LP in the radial direction of the semiconductor wafer W while swirling the same around along the peripheral portion of the semiconductor wafer W allows the swirling trajectory to have a width increased to approximately tens of millimeters. Thus, when the peripheral portion of the semiconductor wafer W where a relative temperature decrease has occurred due to the preheating using the halogen lamps HL has a large width, the entire peripheral portion is scanned uniformly with the irradiation spot LP of the laser light, so that the temperature of the entire peripheral portion is increased. This achieves a uniform in-plane temperature distribution of the semiconductor wafer W.

<Third Preferred Embodiment>

Next, a third preferred embodiment according to the present invention will be described. FIG. 15 is a view showing a configuration of the auxiliary irradiation part 40 according to the third preferred embodiment. Like reference numerals and characters are used in FIG. 15 to designate components identical with those in FIG. 9. The auxiliary irradiation part 40 according to the third preferred embodiment includes a galvanometer mirror 49 in place of the laser light emitting part 45 of the first and second preferred embodiments. The galvanometer mirror 49 includes two mirrors individually rotatable through an angle dependent upon a driving voltage to allow incident laser light to scan a two-dimensional surface (in X and Y directions) while reflecting the incident laser light. The configuration of the heat treatment apparatus 1 according to the third preferred embodiment is similar to that according to the first preferred embodiment except that the auxiliary irradiation part 40 includes the galvanometer mirror 49 in place of the laser light emitting part 45. A procedure for the treatment of a semiconductor wafer W in the heat treatment apparatus 1 according to the third preferred embodiment is also generally similar to that according to the first preferred embodiment.

In the third preferred embodiment, laser light emitted from the laser unit 41 is guided through the optical fiber 42 to the lens 43. The laser light exiting the lens 43 enters the galvanometer mirror 49. The galvanometer mirror 49 causes the two mirrors thereof to reflect the laser light coming from the lens 43 toward the semiconductor wafer W held by the holder 7, and also individually drives the two mirrors to scan the semiconductor wafer W within the surface thereof in the X and Y directions with the irradiation spot LP of the laser light exiting the galvanometer mirror 49. This enables the laser light to be directed at any position on the back surface of the semiconductor wafer W held by the holder 7.

The third preferred embodiment provides a high degree of flexibility in the position of irradiation with laser light, as compared with the first and second preferred embodiments. Thus, when a relative temperature decrease, for example, has occurred in the peripheral portion of the semiconductor wafer W due to the preheating using the halogen lamps HL, the peripheral portion of the back surface of the semiconductor wafer W is scanned with the irradiation spot LP of the laser light drawing a circular trajectory. This achieves a uniform in-plane temperature distribution of the semiconductor wafer W, as in the first and second preferred embodiments.

Also, when the semiconductor wafer W has what is called a cold spot which is a local region at a temperature lower than that of other regions, laser light may be directed only onto the lower-temperature local region to eliminate the cold spot. On the other hand, when the semiconductor wafer W has what is called a hot spot which is a local region at a temperature higher than that of other regions, laser light may be directed onto the other regions than the higher-temperature local region to eliminate the hot spot. In other words, the third preferred embodiment is capable of directing laser light onto any region of the semiconductor wafer W. Thus, if there is a nonuniform temperature distribution asymmetrical with respect to the center of the semiconductor wafer W, laser light may be directed onto a region at a relatively low temperature to achieve a uniform in-plane temperature distribution of the semiconductor wafer W. This is accomplished by introducing the concept of trimming into the heating treatment of the semiconductor wafer W.

<Fourth Preferred Embodiment>

Figure 16:
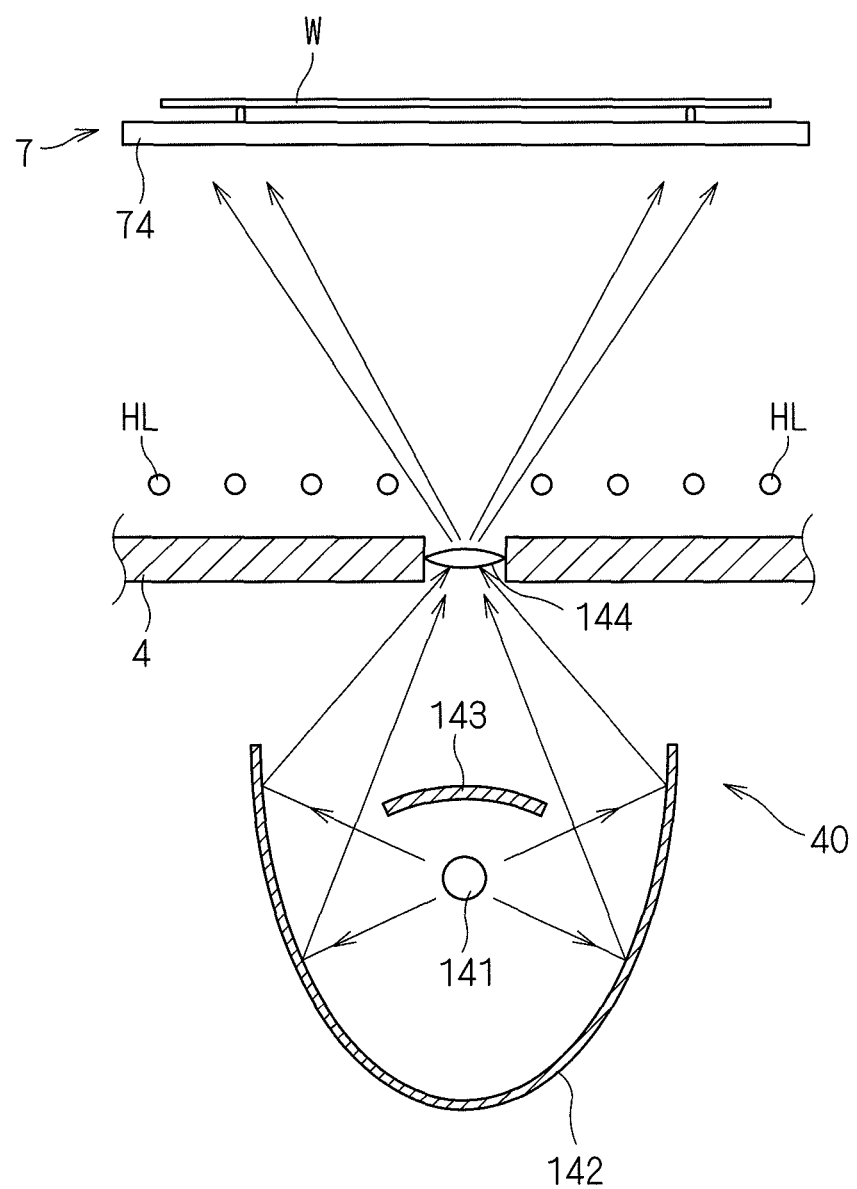
FIG. 16 is a view showing a configuration of the auxiliary irradiation part according to a fourth preferred embodiment of the present invention.

Next, a fourth preferred embodiment according to the present invention will be described. FIG. 16 is a view showing a configuration of the auxiliary irradiation part 40 according to the fourth preferred embodiment. Like reference numerals and characters are used in FIG. 16 to designate components identical with those in FIG. 9. The auxiliary irradiation part 40 according to the fourth preferred embodiment directs arc light toward the peripheral portion of the back surface of a semiconductor wafer W. The configuration of the heat treatment apparatus 1 according to the fourth preferred embodiment is similar to that according to the first preferred embodiment except the configuration of the auxiliary irradiation part 40. A procedure for the treatment of a semiconductor wafer W in the heat treatment apparatus 1 according to the fourth preferred embodiment is also generally similar to that according to the first preferred embodiment.

The auxiliary irradiation part 40 according to the fourth preferred embodiment includes an elliptical mirror 142, an arc lamp 141 disposed inside the elliptical mirror 142, and a reflective plate 143 disposed inside the elliptical mirror 142. The auxiliary irradiation part 40 further includes a lens 144 disposed outside the elliptical mirror 142. The arc lamp 141 is a xenon lamp which utilizes arc discharge, and is provided at a first focal position of the elliptical mirror 142. Arc light emitted from the arc lamp 141 at the first focal position is reflected from the inner surface of the elliptical mirror 142, and is then collected at a second focal position. The lens 144 is provided at the second focal position of the elliptical mirror 142. The arc light collected at the second focal position is transmitted through the lens 144, and then reaches the back surface of the semiconductor wafer W held by the holder 7. As shown in FIG. 16, the reflective plate 143 is disposed immediately over the arc lamp 141 and in the center of the opening of the elliptical mirror 142. For this reason, the arc light collected at the second focal position is the reflected light passing through a gap between the reflective plate 143 and the inner surface of the elliptical mirror 142. Thus, the arc light directed from the lens 144 onto a horizontal surface is in the form of an annular ring. The arc light in the form of an annular ring impinges upon only the peripheral portion of the back surface of the semiconductor wafer W held by the holder 7.

In the fourth preferred embodiment, the arc light in the form of an annular ring is directed from the auxiliary irradiation part 40 toward the peripheral portion of the semiconductor wafer W where a relative temperature decrease has occurred due to the preheating using the halogen lamps HL. This raises the temperature of the peripheral portion of the semiconductor wafer W to achieve a uniform in-plane temperature distribution of the semiconductor wafer W, as in the first and second preferred embodiments.

<Fifth Preferred Embodiment>

Figure 17:
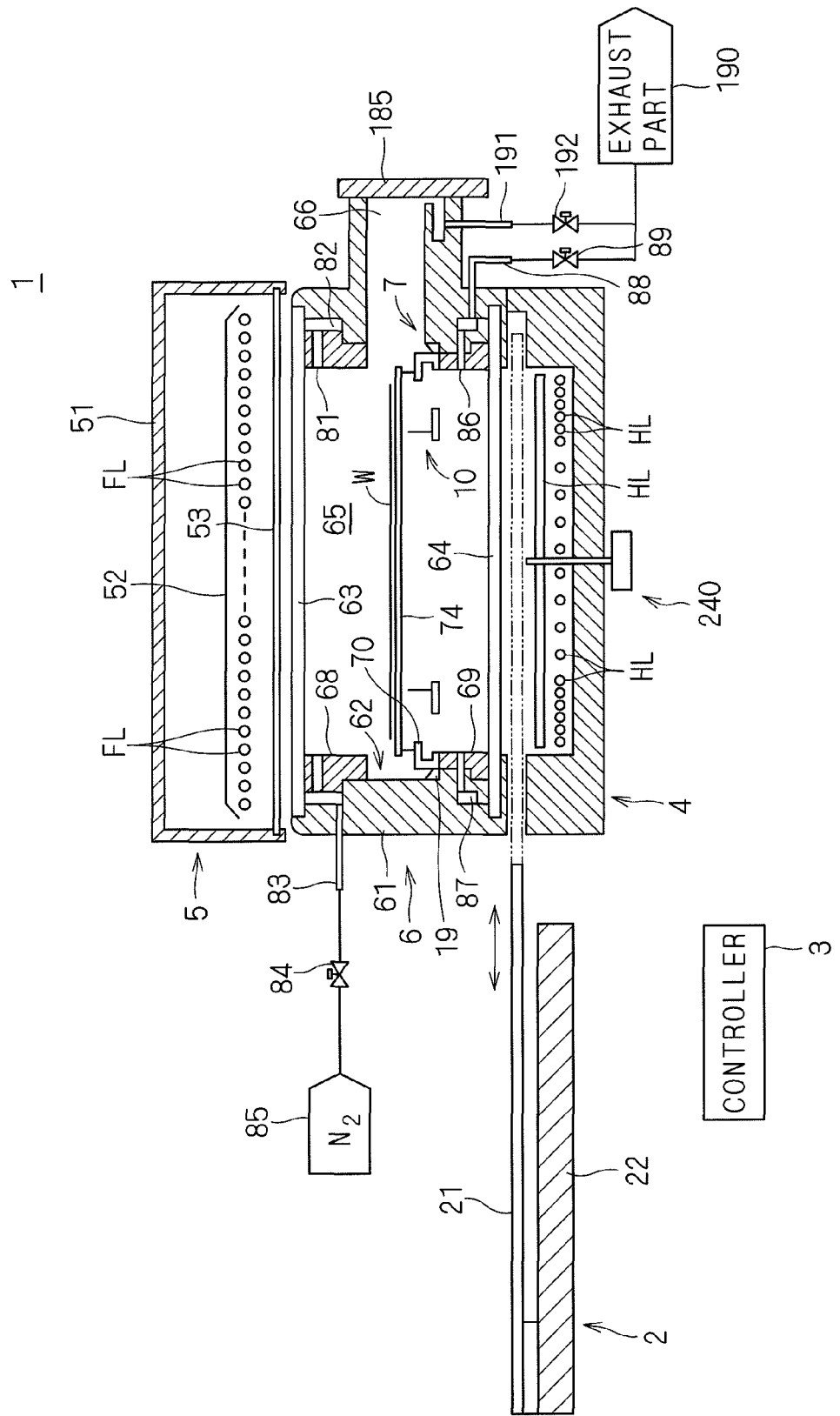
FIG. 17 is a longitudinal sectional view showing a configuration of the heat treatment apparatus according to a fifth preferred embodiment of the present invention.

FIG. 17 is a longitudinal sectional view showing a configuration of the heat treatment apparatus 1 according to a fifth preferred embodiment of the present invention. Like reference numerals and characters are used in FIG. 17 to designate components identical with those of the first preferred embodiment. The heat treatment apparatus 1 according to the fifth preferred embodiment differs in the provision of a reflective part 19 and in the shape of a laser light emitting part 245 from that according to the first preferred embodiment. The remaining structure of the fifth preferred embodiment is similar to that of the first preferred embodiment, and will be described in a simplified manner as appropriate.

Figure 19:
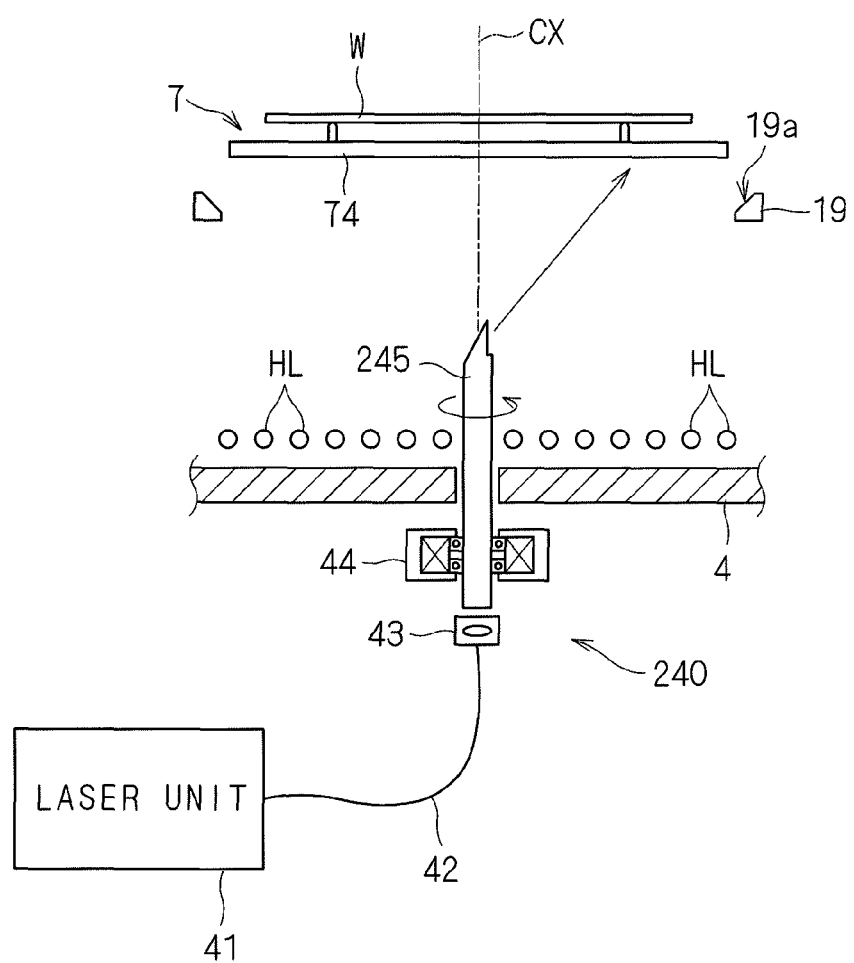
FIG. 19 is a view showing a configuration of the auxiliary irradiation part according to the fifth preferred embodiment.

FIG. 18 is a plan view showing an arrangement of the halogen lamps HL according to the fifth preferred embodiment. FIG. 19 is a view showing a configuration of an auxiliary irradiation part 240 according to the fifth preferred embodiment. In FIG. 19, the configurations of the halogen heating part 4 and the chamber 6 are shown in simplified form for convenience of illustration. Like reference numerals and characters are used in FIG. 19 to designate components identical with those of the first preferred embodiment shown in FIG. 9. The auxiliary irradiation part 240 includes the laser unit 41, the laser light emitting part 245, and the rotary motor 44. The laser unit 41 according to the fifth preferred embodiment is a very high power semiconductor laser which provides a power output of 80 to 500 W, and emits visible laser light having a wavelength of 800 to 820 nm. The laser light emitted from the laser unit 41 is guided through the optical fiber 42 to the lens 43. The laser light exiting the lens 43 enters the laser light emitting part 245.

Figure 20:
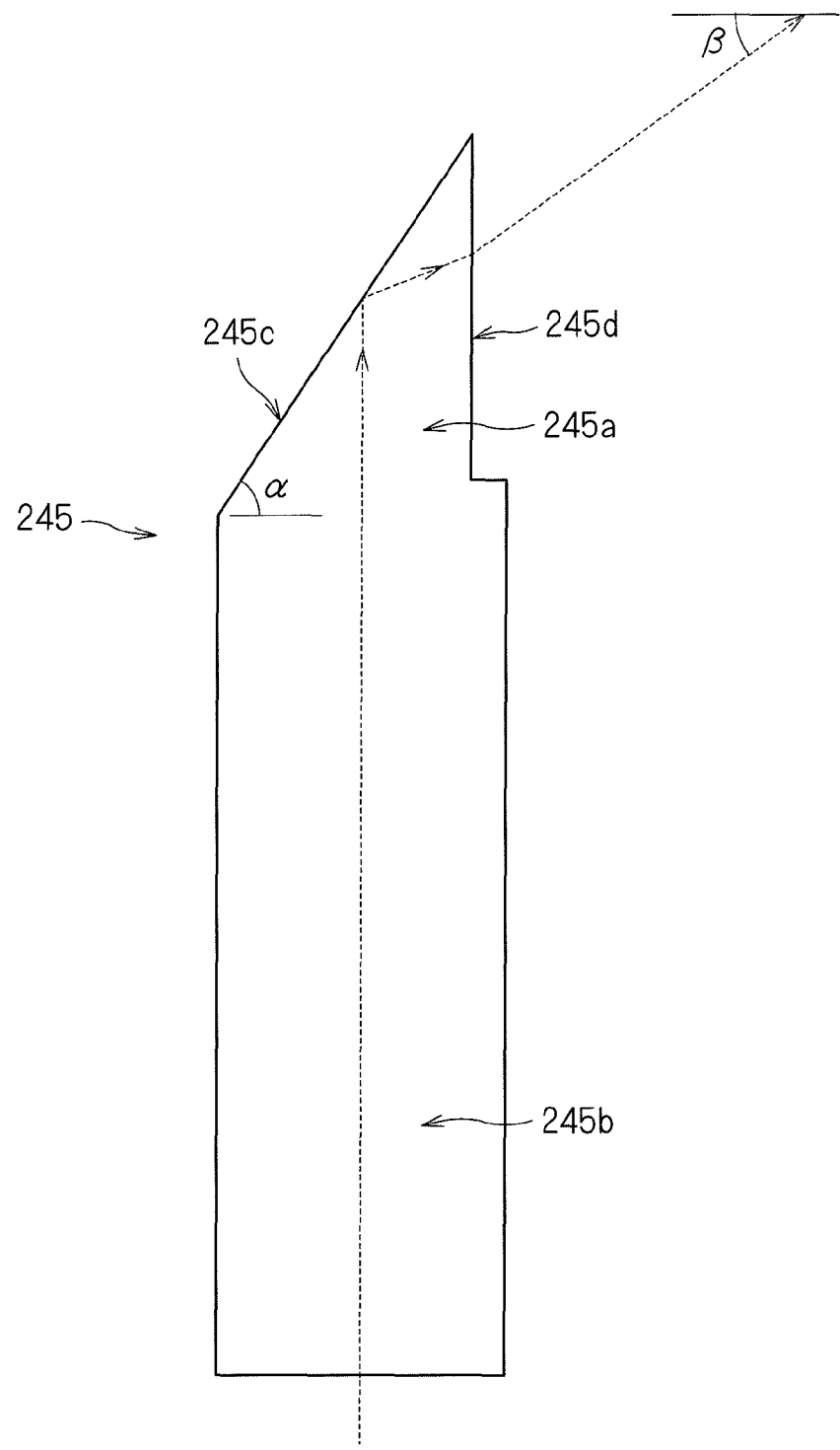
FIG. 20 is a longitudinal sectional view of the laser light emitting part according to the fifth preferred embodiment.

FIG. 20 is a longitudinal sectional view of the laser light emitting part 245 according to the fifth preferred embodiment. The laser light emitting part 245 is a generally rod-shaped optical member made of quartz. The laser light emitting part 245 includes a light emitting part 245a positioned at the upper end thereof, and a light guiding part 245b provided under the light emitting part 245a and extending in a vertical direction. The light guiding part 245b is of a cylindrical configuration, and has a diameter of 15 mm according to the fifth preferred embodiment. The light emitting part 245a is provided with a reflective surface 245c, and an exit surface 245d. In the fifth preferred embodiment, the exit surface 245d extends in a vertical direction, and the reflective surface 245c extends at an angle α of 56.7 degrees with respect to a horizontal plane. The laser light emitting part 245 may be produced by cutting out the reflective surface 245c and the exit surface 245d from a single cylindrical quartz rod or by bonding the light emitting part 245a and the light guiding part 245b as separate quartz members together.

The laser light emitting part 245 is disposed immediately under the center of a semiconductor wafer W held by the holder 7. Specifically, the laser light emitting part 245 is provided so that the center line CX (with reference to FIG. 19) passing vertically through the center of the semiconductor wafer W held in a horizontal position by the holder 7 coincides with the central axis of the light guiding part 245b of the cylindrical configuration.

With reference to FIG. 19, the laser light emitting part 245 is rotatable about the central axis of the light guiding part 245b (i.e., the center line CX of the semiconductor wafer W) by the rotary motor 44 provided under the halogen heating part 4. The rotary motor 44 according to the fifth preferred embodiment is a hollow motor having a hollow motor shaft. The lower end of the light guiding part 245b is inserted through the hollow portion of the rotary motor 44. The lens 43 is disposed in a position opposed to the lower end surface of the light guiding part 245b.

The light guiding part 245b has an upper end portion extending through the bottom wall of the halogen heating part 4 and a reflector not shown for the halogen lamps HL. The light guiding part 245b may be provided with a bearing in a location where the light guiding part 245b passes through the bottom wall of the halogen heating part 4. The light guiding part 245b extends further through a gap between the arranged halogen lamps HL (with reference to FIG. 18), and has an upper end provided at least above the halogen lamps HL in the upper tier. The light emitting part 245a is provided in continuation to the upper end of the light guiding part 245b. This prevents the laser light emitting part 245 and the halogen lamps HL from coming into contact with each other even when the laser light emitting part 245 rotates.

As shown in FIG. 20, laser light emitted from the laser unit 41, passing through the lens 43, and entering the lower end surface of the light guiding part 245b of the laser light emitting part 245 perpendicularly thereto travels in a straight line along the length of the light guiding part 245b extending in a vertical direction. In other words, the incoming laser light is guided in parallel with the central axis of the light guiding part 245b toward the light emitting part 245a provided over the light guiding part 245b. Then, the laser light guided in the light guiding part 245b is totally reflected from the reflective surface 245c of the light emitting part 245a toward the exit surface 245d, and is then directed from the exit surface 245d toward the peripheral portion of the semiconductor wafer W held by the holder 7. The laser light is slightly refracted when exiting the light emitting part 245a made of quartz into the atmosphere. As a result, the laser light exiting the laser light emitting part 245 forms an angle β of approximately 35 degrees with a horizontal plane. The angle β which shall be approximately 35 degrees in the fifth preferred embodiment, may take an appropriate value in accordance with the arrangement and configuration of the heat treatment apparatus 1 (e.g., a positional relationship between the laser light emitting part 245 and the semiconductor wafer W). More specifically, the angle β may be adjusted depending on the angle α formed by the reflective surface 245c and a horizontal plane.

The rotary motor 44 rotates the laser light emitting part 245 about the center line CX, while the laser light is directed outwardly from the laser light emitting part 245. Thus, an irradiation spot of the laser light swirls around along the peripheral portion of the semiconductor wafer W. The irradiation of the peripheral portion of the semiconductor wafer W with laser light by means of the auxiliary irradiation part 240 will be further described later.

Figure 21:
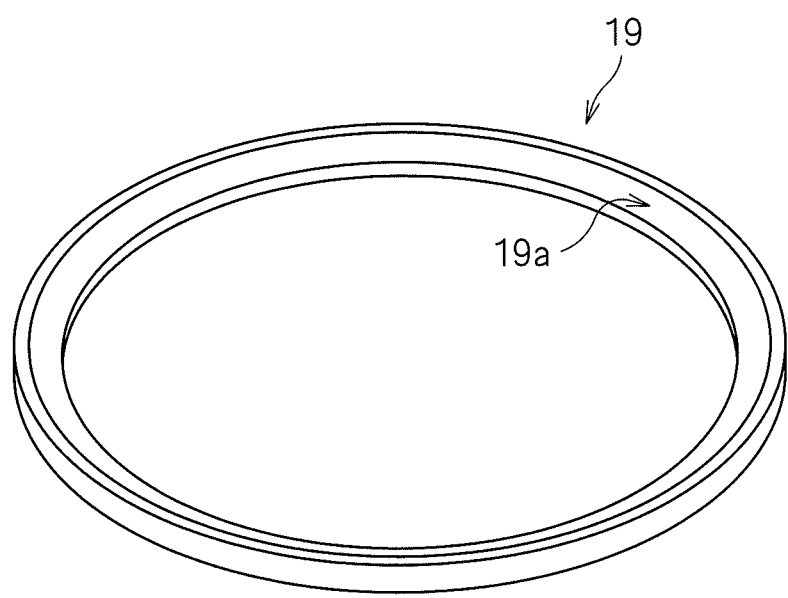
FIG. 21 is a perspective view of a reflective part.

The heat treatment apparatus 1 according to the fifth preferred embodiment further includes the reflective part 19 for further reflecting the laser light directed from the auxiliary irradiation part 240 and reflected from the lower surface of the semiconductor wafer W. FIG. 21 is a perspective view of the reflective part 19. For adaptation to the laser light emitting part 245 which rotates while directing the laser light obliquely upwardly, the reflective part 19 in the form of an annular ring is provided under the outside of the semiconductor wafer W held by the holder 7. The center of the reflective part 19 in the form of an annular ring coincides with the center line CX of the semiconductor wafer W held by the holder 7. The reflective part 19 may be provided, for example, in the recessed portion 62 of the chamber 6 (with reference to FIG. 17).

The reflective part 19 has a mirror surface 19a in opposed relation to the peripheral portion of the semiconductor wafer W held by the holder 7. The mirror surface 19a is a tapered surface in the form of an annular ring, and is mirror-finished to have a high reflectance. The angle which the mirror surface 19a forms with a horizontal plane is designed so that the angle of incidence at which the laser light reflected from the lower surface of the semiconductor wafer W enters the mirror surface 19a is zero degrees. In the fifth preferred embodiment, the angle which the mirror surface 19a forms with a horizontal plane is approximately 55 degrees because the angle β formed by the laser light exiting the laser light emitting part 245 and a horizontal plane is approximately 35 degrees.

A procedure for the treatment of a semiconductor wafer W in the heat treatment apparatus 1 according to the fifth preferred embodiment is also generally similar to that according to the first preferred embodiment. Specifically, a semiconductor wafer W to be treated herein is a semiconductor substrate doped with impurities (ions) by an ion implantation process. The impurities are activated by the heat treatment apparatus 1 performing the process of heating (annealing) the semiconductor wafer W by irradiation with flashes of light.

In the fifth preferred embodiment, an ion-implanted semiconductor wafer W is also transported into the chamber 6, is held by the holder 7, and is preheated by the halogen lamps HL. As in the first preferred embodiment, the semiconductor wafer W during the preheating shows a tendency to be lower in temperature in a peripheral portion thereof, as compared with the temperature in a central portion thereof.

To prevent such a phenomenon, the halogen lamps HL in the halogen heating part 4 are disposed at a higher density in a region opposed to the peripheral portion of the semiconductor wafer W than in a region opposed to the central portion thereof, so that a greater amount of light is directed toward the peripheral portion of the semiconductor wafer W than toward the central portion thereof. Additionally, the inner peripheral surface of the lower reflective ring 69 mounted to the chamber side portion 61 is provided as a mirror surface. Thus, a greater amount of light is reflected from the inner peripheral surface of the lower reflective ring 69 toward the peripheral portion of the semiconductor wafer W.

Even though the amount of halogen light impinging upon the peripheral portion of the semiconductor wafer W is made greater than that impinging upon the central portion thereof, it has still been difficult to solve the problem of the decrease in the temperature of the peripheral portion of the semiconductor wafer W. This tendency becomes more pronounced as a distance between the halogen lamps HL and the semiconductor wafer W held by the holder 7 increases. Also, further increase in the amount of light directed from the halogen heating part 4 onto the peripheral portion of the semiconductor wafer W might further impair the uniformity of the in-plane temperature distribution as shown in FIG. 27B.

To solve such a problem, the auxiliary irradiation part 240 for additionally irradiating the peripheral portion of the semiconductor wafer W held by the holder 7 with light is provided in the fifth preferred embodiment. The laser unit 41 in the auxiliary irradiation part 240 emits visible laser light having a wavelength of 800 to 820 nm with a power output of 80 to 500 W. The laser light emitted from the laser unit 41 and guided through the optical fiber 42 to the lens 43 comes through the lens 43 into the light guiding part 245b of the laser light emitting part 245. The laser light exits the lens 43 vertically upwardly, and enters the lower end surface of the light guiding part 245b perpendicularly thereto.

As shown in FIG. 20, the laser light entering the lower end surface of the light guiding part 245b perpendicularly thereto is guided to the light emitting part 245a provided over the light guiding part 245b. After being reflected from the reflective surface 245c, the laser light exits the exit surface 245d toward the peripheral portion of the semiconductor wafer W held by the holder 7 (obliquely upwardly). FIG. 22 is a view showing the irradiation of the peripheral portion of the semiconductor wafer W with laser light by the use of the auxiliary irradiation part 240 and the reflective part 19. The visible laser light having a wavelength of 800 to 820 nm and exiting the light emitting part 245a of the laser light emitting part 245 reaches the peripheral portion of the lower surface of the semiconductor wafer W held by the holder 7, as indicated by the arrow AR1. It should be noted that the holder 7, which is entirely made of quartz, allows the visible laser light having a wavelength of 800 to 820 nm and exiting the laser light emitting part 245 to pass therethrough. On the other hand, the semiconductor wafer W made of silicon which is raised in temperature to a certain degree by the halogen heating part 4 absorbs the laser light having a wavelength of 800 to 820 nm. Thus, the laser light exiting the laser light emitting part 245 is directed onto and absorbed by the peripheral portion of the semiconductor wafer W to raise the temperature of the irradiated region of the semiconductor wafer W.

However, even the semiconductor wafer W raised in temperature to a certain degree does not absorb all of the laser light directed thereonto but reflects approximately 40% of the laser light. Specifically, part of the laser light directed from the laser light emitting part 245 onto the peripheral portion of the semiconductor wafer W is absorbed by the semiconductor wafer W, but part of the laser light is reflected from the semiconductor wafer W, as indicated by the arrow AR2. In the fifth preferred embodiment, the angle formed by the laser light reflected from the semiconductor wafer W and the semiconductor wafer W held in a horizontal position is approximately 35 degrees because the angle β formed by the laser light exiting the laser light emitting part 245 and the semiconductor wafer W is approximately 35 degrees.

The laser light directed from the laser light emitting part 245 and reflected from the peripheral portion of the lower surface of the semiconductor wafer W reaches the mirror surface 19a of the reflective part 19, and is further reflected therefrom. The mirror surface 19a is a tapered surface such that the angle of incidence at which the laser light reflected from the lower surface of the semiconductor wafer W enters the mirror surface 19a is zero degrees. In other words, the laser light reflected from the semiconductor wafer W enters the mirror surface 19a perpendicularly thereto. Thus, the angle of reflection at which the laser light is reflected from the mirror surface 19a is also zero degrees. As a result, the laser light reflected from the mirror surface 19a reaches the peripheral portion of the lower surface of the semiconductor wafer W again, as indicated by the arrow AR3.

In this manner, the reflective part 19 further reflects the laser light directed from the auxiliary irradiation part 240 and reflected from a local region of the lower surface of the semiconductor wafer W to cause the laser light to reach the local region. Thus, the direct light from the laser light emitting part 245 and the reflected light from the reflective part 19 in overlapping relation impinge upon the peripheral portion of the semiconductor wafer W to thereby raise the temperature of the irradiated region with higher efficiency.

Also, part of the laser light reflected from the reflective part 19 is further reflected from the lower surface of the semiconductor wafer W. Since the angle of reflection from the reflective part 19 is zero degrees, the laser light reflected from the reflective part 19 travels along the same optical path as the light exiting the laser light emitting part 245 in the reverse direction, and is reflected from the lower surface of the semiconductor wafer W back to the laser light emitting part 245. This prevents a harmful effect such that the laser light reflected from the reflective part 19 is repeatedly reflected multiple times within the chamber 6 to heat an unintended area. Part of the light reflected back to the laser light emitting part 245 passes through the optical fiber 42 to reach the laser unit 41. There is, however, no apprehension that this reflected light, which is attenuated to a considerable degree after being repeatedly reflected between the semiconductor wafer W and the reflective part 19, exerts influence on the laser unit 41.

In the fifth preferred embodiment, the rotary motor 44 rotates the laser light emitting part 245 about the center line CX of the semiconductor wafer W, as shown in FIGS. 19 and 22, while the laser light is directed from the laser light emitting part 245 toward the peripheral portion of the semiconductor wafer W. As a result, an irradiation spot LP of the laser light exiting the laser light emitting part 245 swirls around along the peripheral portion of the lower surface of the semiconductor wafer W so as to draw a circular trajectory as shown in FIG. 23. The laser light directed from the laser light emitting part 245 and reflected from the lower surface of the semiconductor wafer W accordingly swirls around so as to draw a circular trajectory. The reflective part 19 is in the form of an annular ring, and the center of the reflective part 19 coincides with the center line CX of the semiconductor wafer W held by the holder 7. Thus, the mirror surface 19a of the reflective part 19 in the form of an annular ring, the peripheral portion of the lower surface of the semiconductor wafer W, and the laser light emitting part 245 rotated about the center line CX are always in a constant positional relationship relative to each other in a circumferential direction of the semiconductor wafer W. Thus, the light reflected from the reflective part 19 always impinges upon the irradiation spot LP, and swirls around as the laser light emitting part 245 is rotated. It should be noted that the rotary motor 44 causes the laser light emitting part 245 to make 5 to 200 rotations per second (in this preferred embodiment, 20 rotations per second).

Thus, the laser light (the direct light and the reflected light) is directed onto the peripheral portion of the semiconductor wafer W where a relative temperature decrease has occurred in a preheating stage to raise the temperature of the peripheral portion, thereby improving the uniformity of the in-plane temperature distribution. The start of the irradiation with laser light from the laser light emitting part 245 may be timed to coincide with the turning on of the halogen lamps HL, or to be a predetermined time period later or earlier than the turning on of the halogen lamps HL.

The flash lamps FL emit flashes of light at the point in time when a predetermined time period has elapsed since the temperature of the semiconductor wafer W reached the preheating temperature T1. The irradiation of the semiconductor wafer W with flashes of light in the fifth preferred embodiment is similar to that in the first preferred embodiment. The irradiation of the semiconductor wafer W with flashes of light from the flash lamps FL causes the surface temperature of the semiconductor wafer W to increase slowly from the preheating temperature T1 to the intended treatment temperature T2, and then to decrease slowly. However, the surface temperature of the semiconductor wafer W can be said to increase slowly and then to decrease slowly, as compared with that obtained by conventional flash lamp annealing, and the light emission time of the flash lamps FL is not greater then one second. Thus, the increase and decrease in the surface temperature according to this preferred embodiment occur in a significantly short time, as compared with those caused by the heating by irradiation with light using halogen lamps and the like. In the fifth preferred embodiment, the in-plane temperature distribution of the semiconductor wafer W is made uniform in the preheating stage by the irradiation of the semiconductor wafer W with the direct laser light from the laser light emitting part 245 and with the reflected laser light from the reflective part 19. This makes the in-plane temperature distribution of the surface of the semiconductor wafer W also uniform during, the irradiation with flashes of light.

After a predetermined time period has elapsed since the completion of the flash heating treatment, the halogen lamps HL turn off. The irradiation with the laser light from the auxiliary irradiation part 240 also stops. This stops the irradiation with the reflected light from the reflective part 19 as a matter of course to increase the speed at which the temperature of the semiconductor wafer W decreases. At the same time that the halogen lamps HL turn off, the shutter mechanism 2 inserts the shutter plate 21 into the light shielding position lying between the halogen heating part 4 and the chamber 6. The temperatures of filaments and tube walls of the halogen lamps HL do not decrease immediately after the halogen lamps HL turn off, but radiant heat is continuously emitted from the filaments and the tube walls at elevated temperature for a short time interval to obstruct the temperature decrease of the semiconductor wafer W. The insertion of the shutter plate 21 interrupts the radiant heat emitted from the halogen lamps HL immediately after the turning off toward the heat treatment space 65 to increase the speed at which the temperature of the semiconductor wafer W decreases. It should be noted that the irradiation with the laser light from the auxiliary irradiation part 240 may be stopped before the halogen lamps HL turn off.

After the temperature of the semiconductor wafer W decreases to a predetermined temperature or below, the pair of transfer arms 11 of the transfer mechanism 10 are moved horizontally again from the retracted position to the transfer operation position and are then moved upwardly, whereby the lift pins 12 protrude from the upper surface of the holding plate 74 to receive the heat-treated semiconductor wafer W from the holding plate 74. Subsequently, the transport opening 66 which has been closed is opened by the gate valve 185, and the transport robot outside the heat treatment apparatus 1 transports the semiconductor wafer W placed on the lift pins 12 to the outside. Thus, the heat treatment apparatus 1 completes the heating treatment of the semiconductor wafer W.

In the fifth preferred embodiment, the auxiliary irradiation part 240 irradiates a semiconductor wafer W with laser light to correct the nonuniformity of the in-plane temperature distribution of the semiconductor wafer W resulting from the preheating from the halogen lamps HL. When a semiconductor wafer W held by the holder 7 is preheated by the halogen lamps HL, the semiconductor wafer W shows a tendency to be lower in temperature in a peripheral portion thereof than in a central portion thereof. The irradiation of the peripheral portion with laser light from the auxiliary irradiation part 240 selectively heats the peripheral portion to achieve a uniform in-plane temperature distribution of the semiconductor wafer W.

In particular, the heat treatment apparatus 1 according to the fifth preferred embodiment includes the reflective part 19 which further reflects the laser light directed from the auxiliary irradiation part 240 and reflected from a local region of the lower surface of the semiconductor wafer W to cause the laser light to reach the local region. This causes the laser light reflected from the semiconductor wafer W to impinge upon the same region again, thereby allowing the reuse of the laser light. Thus, the efficiency of the use of the laser light directed from the auxiliary irradiation part 240 is enhanced. As a result, the heat treatment apparatus 1 according to the fifth preferred embodiment is capable of heating the peripheral portion of the semiconductor wafer W which tends to be lower in temperature than the central portion thereof with higher efficiency, thereby achieving a uniform in-plane temperature distribution of the semiconductor wafer W.

Also, the light directed from the auxiliary irradiation part 240 and reflected from the lower surface of the semiconductor wafer W enters the mirror surface 19a of the reflective part 19 at an incidence angle of zero degrees. Thus, the light reflected from the reflective part 19 finally returns to the laser light emitting part 245. This prevents the laser light reflected from the reflective part 19 from heating an unintended area within the chamber 6.

Also, the laser light emitting part 245 is rotated about the center line CX of the semiconductor wafer W in the fifth preferred embodiment, while the laser light is directed from the laser light emitting part 245 disposed immediately under the center of the semiconductor wafer W held by the holder 7 toward the peripheral portion of the semiconductor wafer W. Thus, the irradiation spot LP of the laser light exiting the laser light emitting part 245 swirls around along the peripheral portion of the lower surface of the semiconductor wafer W so as to draw a circular trajectory. As a result, the entire peripheral portion of the semiconductor wafer W at lowered temperature is uniformly heated. This achieves a uniform in-plane temperature distribution of the semiconductor wafer W. It should be noted that, even when the irradiation spot LP of the laser light swirls around along the peripheral portion of the lower surface of the semiconductor wafer W so as to draw a circular trajectory, the reflective part 19 which is in the form of an annular ring is capable of always reflecting the laser light reflected from the peripheral portion of the lower surface of the semiconductor wafer W toward the peripheral portion of the lower surface.

The heat treatment apparatus 1 according to the present invention includes the three types of heat sources of light irradiation type. Specifically, the heat treatment apparatus 1 includes the flash lamps FL which perform flash heating for the activation of impurities, the halogen lamps HL for preheating a semiconductor wafer W prior to the irradiation with flashes of light, and the auxiliary irradiation part 240 which irradiates the peripheral portion of the semiconductor wafer W with laser light. The heat treatment apparatus 1 according to the fifth preferred embodiment further includes the reflective part 19 which further reflects the laser light reflected from the lower surface of the semiconductor wafer W toward the peripheral portion thereof. The irradiation with the direct laser light from the auxiliary irradiation part 240 and with the reflected laser light from the reflective part 19 is performed to compensate for the decrease in temperature of the peripheral portion of the semiconductor wafer W which is inevitably caused when only the amount of light from the halogen lamps HL is adjusted. This improves the uniformity of the in-plane temperature distribution of the semiconductor wafer W in the preheating stage to consequently finally achieve the uniform in-plane temperature distribution of the semiconductor wafer W during the irradiation with flashes of light.

<Sixth Preferred Embodiment>

Next, a sixth preferred embodiment according to the present invention will be described. FIG. 24 is a view showing a configuration of the auxiliary irradiation part 240 according to the sixth preferred embodiment. Like reference numerals and characters are used in FIG. 24 to designate components identical with those in FIGS. 13 and 19. The auxiliary irradiation part 240 according to the sixth preferred embodiment includes a cam mechanism similar to that of the second preferred embodiment in addition to the components of the fifth preferred embodiment. Specifically, the auxiliary irradiation part 240 according to the sixth preferred embodiment includes the cam-follower 47 fixedly provided on the rotary motor 44, and the cam 46 abutting against the cam-follower 47. The configuration of the heat treatment apparatus 1 according to the sixth preferred embodiment is similar to that according to the fifth preferred embodiment except that the auxiliary irradiation part 240 includes the cam mechanism. A procedure for the treatment of a semiconductor wafer W in the heat treatment apparatus 1 according to the sixth preferred embodiment is also generally similar to that according to the fifth preferred embodiment.

The cam 46 is rotated by a rotary drive mechanism not shown, and the center of rotation of the cam 46 is eccentric. Thus, a distance from the center of rotation of the cam 46 to the point of contact between the cam-follower 47 and the cam 46 is periodically varied as the cam 46 is rotated. The rotation of the cam 46 moves the cam-follower 47 upwardly and downwardly to consequently move the laser light emitting part 245 reciprocatingly in a vertical direction.

In the sixth preferred embodiment, the rotary motor 44 rotates the laser light emitting part 245 about the center line CX of the semiconductor wafer W, while laser light is directed from the laser light emitting part 245 toward the peripheral portion of the semiconductor wafer W. At the same time, the laser light emitting part 245 rotated by the rotary motor 44 is moved reciprocatingly in a vertical direction by the cam 46 and the cam-follower 47. The upward and downward movement of the laser light emitting part 245 which directs laser light obliquely upwardly causes the position reached by the laser light on the lower surface of the semiconductor wafer W to move reciprocatingly in a radial direction. As a result, the irradiation spot LP of the laser light exiting the laser light emitting part 245 swirls around along the peripheral portion of the lower surface of the semiconductor wafer W so as to draw a substantially circular trajectory, and also moves reciprocatingly in the radial direction of the semiconductor wafer W in a manner similar to that shown in FIG. 14. In other words, the irradiation spot LP of the laser light draws a substantially circular trajectory while meandering in the peripheral portion of the lower surface of the semiconductor wafer W. The laser light reflected from the lower surface of the semiconductor wafer W accordingly draws a substantially circular trajectory while meandering. It is hence preferable that the mirror surface 19a of the reflective part 19 has a width not less than the amplitude of the meandering of the reflected laser light.

This allows the swirling trajectory of the irradiation spot LP of the laser light in the peripheral portion of the semiconductor wafer W to have a width, as compared with the fifth preferred embodiment. The irradiation spot LP of the laser light itself has a circular or elliptic shape having a diameter on the order of several millimeters. Reciprocatingly moving the irradiation spot LP in the radial direction of the semiconductor wafer W while swirling the same around along the peripheral portion of the semiconductor wafer W allows the swirling trajectory to have a width increased to approximately tens of millimeters. Thus, when the peripheral portion of the semiconductor wafer W where a relative temperature decrease has occurred due to the preheating using the halogen lamps HL has a large width, the entire peripheral portion is scanned uniformly with the irradiation spot LP of the laser light, so that the temperature of the entire peripheral portion is increased. This achieves a uniform in-plane temperature distribution of the semiconductor wafer W.

<Seventh Preferred Embodiment>

Figure 25:
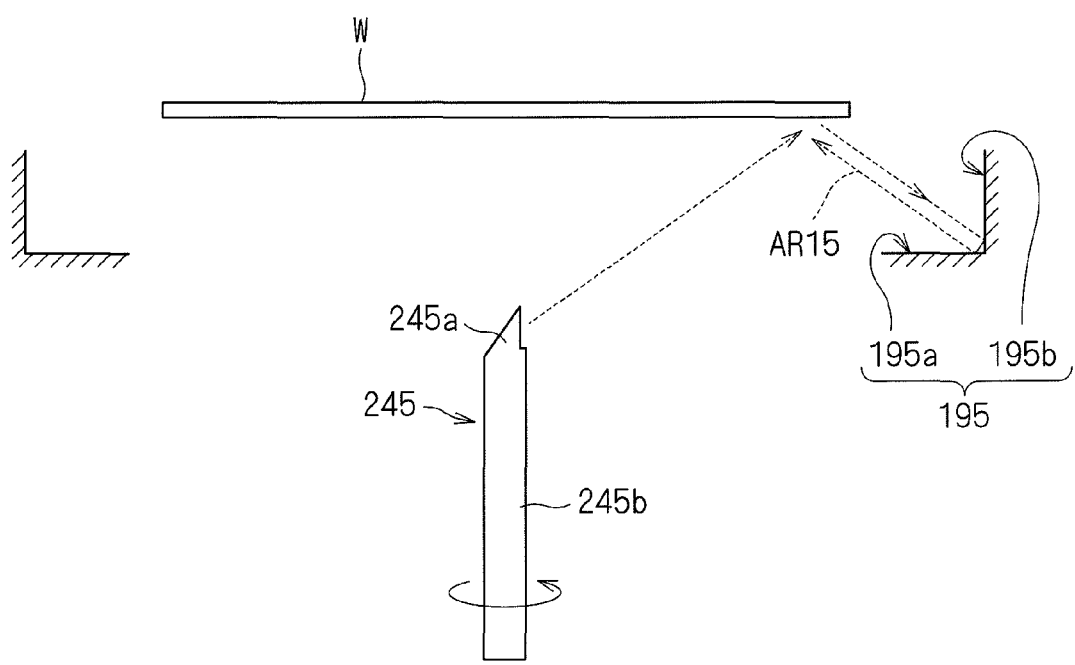
FIG. 25 is a view showing the reflective part according to a seventh preferred embodiment of the present invention.

Next, a seventh preferred embodiment according to the present invention will be described. FIG. 25 is a view showing a reflective part according to the seventh preferred embodiment. Like reference numerals and characters are used in FIG. 25 to designate components identical with those in FIG. 22. Although the reflective part 19 according to the fifth and sixth preferred embodiments is a purpose-built member provided in the form of an annular ring and including the mirror surface 19a, the seventh preferred embodiment uses part of the inner wall surface of the chamber 6 as a reflective part 195. More specifically, the lower corner of the recessed portion 62 constituting the side wall of the chamber 6 is used as the reflective part 195. Since the recessed portion 62 is provided in the form of an annular ring so as to surround the holder 7, the reflective part 195 according to the seventh preferred embodiment is also provided in the form of an annular ring under the outside of a semiconductor wafer W held by the holder 7 as in the fifth preferred embodiment.

In the seventh preferred embodiment, at least the lower corner of the recessed portion 62 provided in the inner side surface of the side wall of the chamber 6 and positioned under the outside of the semiconductor wafer W held by the holder 7 is mirror-finished by electrolytic polishing. Thus, the lower corner of the recessed portion 62 becomes the reflective part 195 including a first mirror surface 195a extending in a horizontal direction, and a second mirror surface 195b extending in a vertical direction. The remaining structure of the seventh preferred embodiment except the reflective part is similar to that of the fifth preferred embodiment.

Also, the laser light emitting part 245 is rotated about the center line CX of the semiconductor wafer W in the seventh preferred embodiment, while the laser light is directed from the laser light emitting part 245 toward the peripheral portion of the semiconductor wafer W. The laser light directed from the laser light emitting part 245 reaches the peripheral portion of the lower surface of the semiconductor wafer W held by the holder 7, and part of the laser light is reflected from the peripheral portion toward the reflective part 195. In the seventh preferred embodiment, the laser light directed from the laser light emitting part 245 and reflected from the peripheral portion of the lower surface of the semiconductor wafer W is further reflected from the reflective part 195, and then reaches the peripheral portion of the lower surface of the semiconductor wafer W again, as indicated by the arrow AR15. To be more precise, each of the first and second mirror surfaces 195a and 195b perpendicular to each other reflects the laser light once, as shown in FIG. 25, whereby the reflective part 195 further reflects the laser light reflected from a local region of the lower surface of the semiconductor wafer W to cause the laser light to reach the local region. Although the susceptor 70 of the holder 7 is placed on the first mirror surface 195a, there is no apprehension that the susceptor 70 interrupts the laser light because the holder 7 including the susceptor 70 is entirely made of quartz.

In this manner, the direct light from the laser light emitting part 245 and the reflected light from the reflective part 195 impinge upon the peripheral portion of the semiconductor wafer W to thereby raise the temperature of the irradiated region with higher efficiency. The configuration in the seventh preferred embodiment also causes the laser light reflected from the semiconductor wafer W to impinge upon the same region again, thereby allowing the reuse of the laser light. Thus, the efficiency of the use of the laser light directed from the auxiliary irradiation part 240 is enhanced. As a result, the heat treatment apparatus 1 according to the seventh preferred embodiment is capable of heating the peripheral portion of the semiconductor wafer W which tends to be lower in temperature than the central portion thereof with higher efficiency, thereby achieving a uniform in-plane temperature distribution of the semiconductor wafer W, as in the fifth preferred embodiment. Additionally, the seventh preferred embodiment, in which the purpose-built reflective part 19 is not provided, eliminates the need to provide the space for placement of the reflective part 19, and also simplifies the configuration of the heat treatment apparatus 1.

<Eighth Preferred Embodiment>

Figure 26:
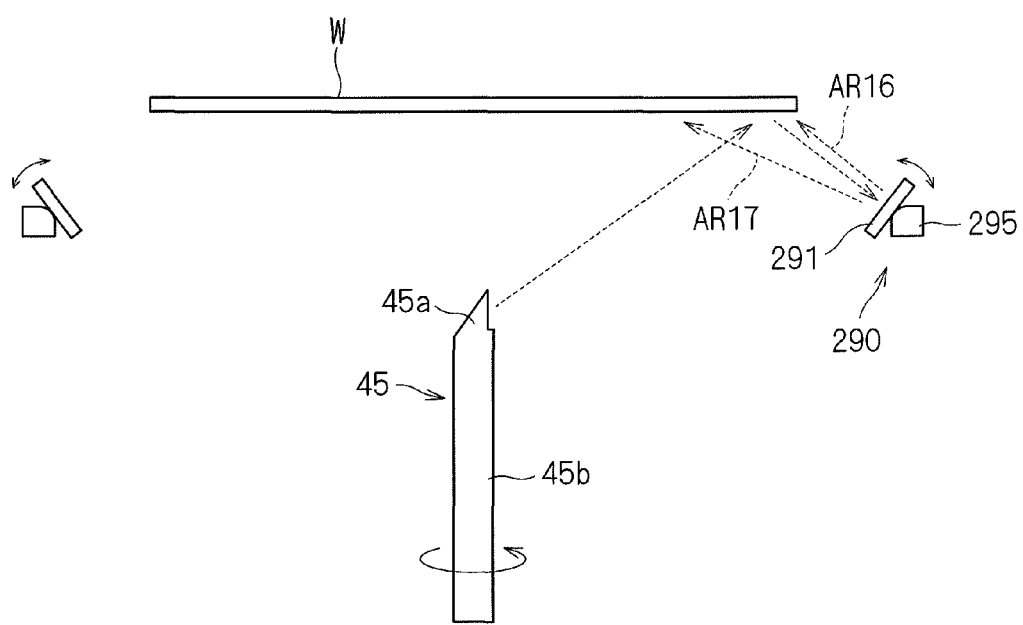
FIG. 26 is a view showing the reflective part according to an eighth preferred embodiment of the present invention.

Next, an eighth preferred embodiment according to the present invention will be described. FIG. 26 is a view showing a reflective part according to the eighth preferred embodiment. Like reference numerals and characters are used in FIG. 26 to designate components identical with those in FIG. 22. In the eighth preferred embodiment, a reflective part 290 includes mirror surfaces 291 having a variable surface angle.

The reflective part 290 according to the eighth preferred embodiment is configured such that the multiple mirror surfaces 291 are arranged in the form of an annular ring under the outside of a semiconductor wafer W held by the holder 7 (e.g., in the recessed portion 62). Each of the mirror surfaces 291 is provided with an inclining mechanism 295 mounted thereto. The inclining mechanism 295 adjusts the surface angle of each of the mirror surfaces 291 (the angle formed by the normal to each of the mirror surfaces 291 and a vertical direction). Various known mechanisms having an angle adjusting capability may be used as the inclining mechanism 295. The remaining structure of the eighth preferred embodiment except the reflective part 290 is similar to that of the fifth preferred embodiment.

Also, the laser light emitting part 245 is rotated about the center line CX of the semiconductor wafer W in the eighth preferred embodiment, while the laser light is directed from the laser light emitting part 245 toward the peripheral portion of the semiconductor wafer W. The laser light directed from the laser light emitting part 245 reaches the peripheral portion of the lower surface of the semiconductor wafer W held by the holder 7, and part of the laser light is reflected from the peripheral portion toward the reflective part 290. The laser light directed from the laser light emitting part 245 and reflected from the peripheral portion of the lower surface of the semiconductor wafer W is further reflected from the mirror surfaces 291 of the reflective part 290, and then reaches the peripheral portion of the lower surface of the semiconductor wafer W again.

In the eighth preferred embodiment, the inclining mechanisms 295 are capable of varying the surface angle of the respective mirror surfaces 291. On the other hand, the direction in which the laser light reflected from the lower surface of the semiconductor wafer W travels toward the reflective part 290 is the same as that in the first preferred embodiment, and is fixed. Thus, the inclining mechanisms 295 vary the surface angle of the respective mirror surfaces 291 of the reflective part 290, whereby the angle of incidence of the laser light reflected from the lower surface of the semiconductor wafer W is varied. A change in angle of incidence entails a change in angle of reflection (i.e., the angle of incidence is equal to the angle of reflection) because regular reflection occurs at the mirror surfaces 291. As a result, as indicated by the arrows AR16 and AR17, the reflective part 290 is capable of changing the direction in which the laser light reflected from the mirror surfaces 291 travels, to adjust the position reached by the laser light on the lower surface of the semiconductor wafer W.

The configuration in the eighth preferred embodiment also causes the laser light reflected from the semiconductor wafer W to impinge upon the same region again, thereby allowing the reuse of the laser light. Thus, the efficiency of the use of the laser light directed from the auxiliary irradiation part 240 is enhanced. As a result, the heat treatment apparatus 1 according to the eighth preferred embodiment is capable of heating the peripheral portion of the semiconductor wafer W which tends to be lower in temperature than the central portion thereof with higher efficiency, thereby achieving a uniform in-plane temperature distribution of the semiconductor wafer W, as in the fifth preferred embodiment. In particular, the inclining mechanisms 295 in the eighth preferred embodiment adjust the angle of incidence at which the laser light reflected from the lower surface of the semiconductor wafer W enters the mirror surfaces 291 of the reflective part 290. This accordingly changes the angle of reflection. Thus, the reflective part 290 is capable of directing the reflected light onto any concentric region about the center line CX in the lower surface of the semiconductor wafer W to heat the concentric region. This achieves a uniform in-plane temperature distribution of the semiconductor wafer W with higher accuracy.

<Modifications>

While the preferred embodiments according to the present invention have been described hereinabove, various modifications of the present invention in addition to those described above may be made without departing from the scope and spirit of the invention. For example, although the cam mechanism is used to move the laser light emitting part 45 (or 245) upwardly and downwardly in the second and sixth preferred embodiments described above, the present invention is not limited thereto. Other elevating drive mechanisms such as an air cylinder and an actuator may be used to move the laser light emitting part 45 reciprocatingly in a vertical direction.

An AOM (acoustic optical modulator) or a KDP (potassium dihydrogen phosphate) may be used to allow laser light to pass therethrough for the scanning, in place of the galvanometer mirror 49 used to reflect laser light for the scanning of the back surface of a semiconductor wafer W. The AOM and the KDP are optical devices which are capable of bending the optical path of incident laser light upon application of voltage to emit the bent optical path, thereby scanning the back surface of a semiconductor wafer W with the irradiation spot LP of the laser light.

In summary, the auxiliary irradiation part 40 used herein may be of the type which directs light onto a local region of a semiconductor wafer W held by the holder 7 which is lower in temperature than other regions thereof to raise the temperature of the local region, thereby providing a uniform in-plane temperature distribution throughout the semiconductor wafer W. Laser light is directed onto the local region in the first to third preferred embodiments, whereas arc light is continuously directed onto the local region in the fourth preferred embodiment. The laser light emitting part 45 which directs laser light obliquely upwardly is rotated in the first and second preferred embodiments, whereby the laser light is directed onto the peripheral portion of a semiconductor wafer W where a relative temperature decrease has occurred. On the other hand, the galvanometer mirror 49 is used in the third preferred embodiment to scan a two-dimensional surface with laser light, whereby the laser light is directed onto the local region.

In place of the optical fiber 42 guiding the laser light emitted from the laser unit 41 toward the lens 43, a collimating lens and a total reflection mirror may be used to guide the laser light emitted from the laser unit 41 toward the lens 43.

In the seventh preferred embodiment, the lower corner of the recessed portion 62 of the chamber 6 is mirror-finished by electrolytic polishing. Alternatively, the lower corner of the recessed portion 62 of the chamber 6 may be mirror-finished by a plating process to form the reflective part 195.

Also, the IGBT 96 is incorporated in the driving circuit for a flash lamp FL to chopper-control the current flowing through the flash lamp FL in the aforementioned preferred embodiments. The technique according to the present invention, however, may be applied to a driving circuit that does not include the IGBT 96. Specifically, light is directed from the auxiliary irradiation part 40 onto a local region of the semiconductor wafer W which is relatively low in temperature in the preheating stage to raise the temperature of the local region, thereby improving the uniformity of the in-plane temperature distribution of the semiconductor wafer W. In that state, the semiconductor wafer W is irradiated with flashes of light in accordance with a single-pulse waveform such that the passage of current is not chopper-controlled. This also achieves a uniform in-plane temperature distribution of the semiconductor wafer W when the semiconductor wafer W is finally irradiated with flashes of light.

Although the IGBT 96 is used as a switching element in the aforementioned preferred embodiments, another transistor capable of turning ON and OFF the circuit in accordance with the signal level inputted to the gate thereof may be used in place of the IGBT 96. It is, however, preferable to use an IGBT and a GTO (gate turn-off) thyristor which are suitable for handling high power as a switching device because the emission of light from the flash lamps FL consumes considerably high power.

The method of setting the waveform of the pulse signal is not limited to inputting the parameters including the pulse width and the like one by one from the input part 33. For example, the setting of the waveform is done by an operator inputting the waveform directly in graphical form from the input part 33, by reading the waveform previously set and stored in a storage part such as a magnetic disk and the like, or by downloading the waveform from outside the heat treatment apparatus 1.

Although the 30 flash lamps FL are provided in the flash heating part 5 according to the aforementioned preferred embodiments, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

Also, in the aforementioned preferred embodiments, the semiconductor wafer W is preheated by irradiating the semiconductor wafer W with halogen light from the halogen lamps HL. The technique for preheating is not limited to this, but the semiconductor wafer W may be preheated by placing the semiconductor wafer W on a hot plate. The hot plate includes concentric zones which are individually temperature-controllable, and the problem of the temperature decrease in the peripheral portion of a semiconductor wafer W is solved by zone control. Thus, more pronounced effects are produced by the application of the technique according to the present invention to an apparatus that preheats a semiconductor wafer W by irradiation with light as in the aforementioned preferred embodiments.

Moreover, a substrate to be processed or treated by the heat treatment apparatus according to the present invention is not limited to a semiconductor wafer, but may be a glass substrate for use in a flat panel display for a liquid crystal display apparatus, and a substrate for a solar cell. Also, the technique according to the present invention may be applied to the joining of metal and silicon, and to the crystallization of polysilicon.

While the invention has been described in detail, the foregoing description is in all aspects illustrative and not restrictive. It is understood that numerous other modifications and variations can be devised without departing from the scope of the invention.

What is claimed is:

1. A heat treatment apparatus for heating a substrate by irradiating the substrate with flashes of light, comprising:
   a holder for holding a substrate in a horizontal position from below;
   a flash lamp for irradiating the substrate held by said holder with flashes of light from above;
   a preheating mechanism for irradiating the substrate held by said holder with light from below to preheat the substrate; and
   an auxiliary irradiation part for directing light onto a local peripheral portion of the substrate preheated by said preheating mechanism, which local peripheral portion is lower in temperature than other regions of the peripheral portion of said substrate.

2. The heat treatment apparatus according to claim 1, wherein said holder is made of quartz,
   said preheating mechanism including a halogen lamp.

3. A heat treatment apparatus for heating a substrate by irradiating the substrate with flashes of light, comprising:
   a holder made of quartz for holding a substrate in a horizontal position from below;
   a flash lamp for irradiating the substrate held by said holder with flashes of light from above;
   a preheating mechanism for irradiating the substrate held by said holder with light from below to preheat the substrate; and
   an auxiliary irradiation part for directing light onto a local region of the substrate held by said holder which is lower in temperature than other regions of the substrate,
   wherein
   said auxiliary irradiation part includes a laser light irradiation part for directing laser light from below onto said local region of the substrate held by said holder.

4. The heat treatment apparatus according to claim 3, wherein
   said laser light irradiation part includes
   a laser light emitting part disposed immediately under the center of the substrate held by said holder and configured to emit laser light toward a peripheral portion of the substrate, and
   a rotating part for rotating said laser light emitting part about the center line of the substrate.

5. The heat treatment apparatus according to claim 4, wherein
   said laser light irradiation part further includes an elevating part for reciprocatingly upwardly and downwardly moving said laser light emitting part rotated by said rotating part.

6. The heat treatment apparatus according to claim 3, wherein
   said laser light irradiation part includes
   a laser light scanning part for scanning a surface of the substrate held by said holder with emitted laser light.

7. A heat treatment apparatus for heating a substrate by irradiating the substrate with flashes of light, comprising:
   a holder made of quartz for holding a substrate in a horizontal position from below;
   a flash lamp for irradiating the substrate held by said holder with flashes of light from above;
   a preheating mechanism for irradiating the substrate held by said holder with light from below to preheat the substrate; and
   an auxiliary irradiation part for directing light onto a local region of the substrate held by said holder which is lower in temperature than other regions of the substrate,
   wherein
   said auxiliary irradiation part includes an arc light irradiation part for directing arc light in the form of an annular ring onto a peripheral portion of the substrate held by said holder.

8. A heat treatment apparatus for heating a substrate by irradiating the substrate with flashes of light, comprising:
   a chamber for receiving a substrate;
   a holder for holding the substrate in a horizontal position from below within said chamber;
   a flash lamp for irradiating the substrate held by said holder with flashes of light from above;
   an auxiliary irradiation part for directing light onto a lower surface of a local region of the substrate held by said holder which is lower in temperature than other regions of the substrate; and
   a reflective part for further reflecting light directed from said auxiliary irradiation part and reflected from the lower surface of said substrate to cause the further reflected light to reach said local region.

9. The heat treatment apparatus according to claim 8, wherein
   the light reflected from the lower surface of the substrate enters said reflective part at an incident angle of zero degrees.

10. The heat treatment apparatus according to claim 8, further comprising
    an angle adjusting mechanism for adjusting an incident angle at which the light reflected from the lower surface of the substrate enters said reflective part.

11. The heat treatment apparatus according to claim 8, wherein said reflective part is a mirror-finished portion of an inner wall surface of said chamber.

12. The heat treatment apparatus according to claim 8, wherein said auxiliary irradiation part includes a laser light irradiation part for directing laser light from below onto said local region of the substrate held by said holder.

13. The heat treatment apparatus according to claim 12, wherein said laser light irradiation part includes a laser light emitting part disposed immediately under the center of the substrate held by said holder and configured to emit laser light toward a peripheral portion of the substrate, and a rotating part for rotating said laser light emitting part about the center line of the substrate, and wherein said reflective part is provided in the form of an annular ring under the outside of said substrate.

14. The heat treatment apparatus according to claim 13, wherein said laser light irradiation part further includes an elevating part for reciprocatingly upwardly and downwardly moving said laser light emitting part rotated by said rotating part.

15. The heat treatment apparatus according to claim 8, wherein said holder is made of quartz, said heat treatment apparatus further comprising a halogen lamp for irradiating the substrate held by said holder with light from below to preheat the substrate.

* * * * *